(12) United States Patent
Hasegawa et al.

(10) Patent No.: US 7,218,485 B2
(45) Date of Patent: May 15, 2007

(54) GMR ELEMENT HAVING FIXED MAGNETIC LAYER PROVIDED ON SIDE SURFACE OF FREE MAGNETIC LAYER

(75) Inventors: Naoya Hasegawa, Niigata-ken (JP); Masamichi Saito, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 530 days.

(21) Appl. No.: 10/755,641

(22) Filed: Jan. 12, 2004

(65) Prior Publication Data

US 2004/0141261 A1 Jul. 22, 2004

(30) Foreign Application Priority Data

Jan. 15, 2003 (JP) ............................. 2003-006631

(51) Int. Cl.
*G11B 5/39* (2006.01)

(52) U.S. Cl. .............. 360/324.11; 360/324; 360/324.1; 360/324.12; 360/314; 338/32 R

(58) Field of Classification Search ........... 360/327.32, 360/327.33, 327.31, 327.3, 324.12, 324.11, 360/314, 316, 324.1, 324, 324.2, 326
See application file for complete search history.

(56) References Cited

U.S. PATENT DOCUMENTS

| | | | |
|---|---|---|---|
| 6,023,395 A | 2/2000 | Dill et al. | |
| 6,134,090 A | 10/2000 | Mao et al. | |
| 6,266,218 B1 * | 7/2001 | Carey et al. | 360/324.12 |
| 6,396,668 B1 * | 5/2002 | Mao et al. | 360/314 |
| 6,411,478 B1 * | 6/2002 | Mao et al. | 360/324.2 |
| 6,515,573 B1 * | 2/2003 | Dong et al. | 338/32 R |
| 6,627,988 B2 * | 9/2003 | Andoh | 257/706 |
| 6,700,753 B2 * | 3/2004 | Singleton et al. | 360/324.1 |
| 6,721,147 B2 * | 4/2004 | Aoshima et al. | 360/324.12 |
| 6,893,740 B2 * | 5/2005 | Saito | 428/668 |
| 6,927,952 B2 * | 8/2005 | Shimizu et al. | 360/324.12 |
| 2002/0191348 A1 * | 12/2002 | Hasegawa et al. | 360/314 |
| 2003/0179517 A1 * | 9/2003 | Horng et al. | 360/324.12 |
| 2003/0202295 A1 * | 10/2003 | Wang et al. | 360/324.12 |
| 2004/0141260 A1 * | 7/2004 | Hasegawa et al. | 360/324.11 |

* cited by examiner

*Primary Examiner*—Wayne Young
*Assistant Examiner*—Natthew Kayrish
(74) *Attorney, Agent, or Firm*—Brinks Hofer Gilson & Lione

(57) ABSTRACT

A free magnetic layer contains free magnetic material layers and an intermediate layer interposed therebetween. A fixed magnetic layer contains fixed magnetic material layers and a non-magnetic intermediate layer interposed therebetween. The free magnetic material layer and the fixed magnetic material layers are formed at equivalent film positions. The magnetizations of the fixed magnetic material layers provided in a vertical direction are antiparallel to each other, and the magnetizations of the free magnetic material layers provided in the vertical direction are antiparallel to each other. By an external magnetic field, the magnetizations of the free magnetic material layer are rotated in phase to magnetization directions of the fixed magnetic material layers.

7 Claims, 15 Drawing Sheets

GMR ELEMENT HAVING FIXED MAGNETIC LAYER PROVIDED ON SIDE SURFACE OF FREE MAGNETIC LAYER

This application claims the benefit of priority to Japanese Patent Application No. 2003-00631 herein incorporated by reference.

BACKGROUND OF THE INVENTION

1. Field of the Invention

The present invention relates to magnetic sensors in which a fixed magnetic layer is provided at least one side surface of a free magnetic layer in a track width direction with a non-magnetic material layer provided therebetween and in which current flows in a direction intersecting an interface between the free magnetic layer and the non-magnetic material layer and an interface between the fixed magnetic layer and the non-magnetic material layer. More particularly, the present invention relates to a magnetic sensor which can increase the rate of change in resistance.

2. Description of the Related Art

In recent years, concomitant with improvement in recording density of recording media, a decrease in the gap length which is defined by the distance between a top and a bottom shield has been increasingly required. The top and bottom shield are made of a magnetic material and are provided on the top and the bottom of a magnetic sensor.

As a major structure of a reproduction magnetic head reading a signal magnetic field from a recording medium, a spin-valve type magnetic sensor has been widely used in which a free magnetic layer and a fixed magnetic layer are laminated to each other perpendicularly to the film surface with a non-magnetic material layer interposed therebetween.

However, in the structure in which a free magnetic layer, a non-magnetic material layer, and a fixed magnetic layer are laminated to each other perpendicularly to the film surface, it becomes difficult to further decrease the gap length.

Accordingly, a magnetic sensor having the following structure has been proposed in which fixed magnetic layers are provided on two side surfaces of a free magnetic layer with non-magnetic material layers provided therebetween, and in which current flows in the direction intersecting each interface between the free magnetic layer and the non-magnetic material layer and each interface between the fixed magnetic layer and the non-magnetic material layer.

FIG. 14 is a partial cross-sectional view of a magnetic sensor 1, when it is viewed from a face opposing a recording medium, in which a sense current flows in the direction intersecting the interfaces described above. In the magnetic sensor 1, a free magnetic layer 5 in the form of approximately trapezoid, which is made of a soft magnetic material such as NiFe, is formed above a lower shield layer 2 made of a magnetic material with a lower gap layer 3 of an insulating material and an underlying layer 4 provided therebetween. On the two side surfaces of the free magnetic layer 5 and on the lower gap layer 3, non-magnetic material layers 6 are formed. In addition, fixed magnetic layers 7 made of a soft magnetic material such as NiFe are formed in contact with the respective non-magnetic material layers 6. Antiferromagnetic layers 8 are provided on the respective fixed magnetic layers 7, an exchange coupling magnetic field is generated at each of interfaces between the fixed magnetic layers 7 and the antiferromagnetic layers 8, and the magnetizations of the fixed magnetic layers 7 are fixed in a Y direction in the figure. On the free magnetic layer 5 and the antiferromagnetic layers 8, an upper gap layer 9 made of an insulating material and an upper shield layer 10 made of a magnetic material are formed.

A sense current of the magnetic sensor 1 described above flows in the fixed magnetic layers 7, the non-magnetic material layers 6, and the free magnetic layer in the direction intersecting the interfaces between the fixed magnetic layers 7 and the non-magnetic material layers 6 and the interfaces between the non-magnetic material layers 6 and the free magnetic layer 5 (X direction in the figure).

The free magnetic layer 5 is placed in a single domain state in the X direction in the figure, and when an external magnetic field is applied in the Y direction in the figure, the magnetization of the free magnetic layer 5 is rotated in the Y direction in the figure. While the magnetizations of the fixed magnetic layers 7 are fixed in the Y direction in the figure, when the magnetization of the free magnetic layer 5 is rotated, the resistance of the magnetic sensor is changed. When this change in resistance is read as the change in current or the change in voltage, an external magnetic field can be detected.

Magnetic sensors as described above are disclosed, for example, in U.S. Pat. Nos. 6,396,668B1 and 6,411,478B1, and Japanese Unexamined Patent Application Publication No. 2001-319313 (p.6, FIG. 2). A magnetic sensor disclosed in U.S. Pat. No. 6,396,668B1 is a spin-valve type GMR element, and magnetic sensors disclosed in U.S. Pat. No. 6,411,478B1 and Japanese Unexamined Patent Application Publication No. 2001-319313 are tunneling MR elements.

In the magnetic sensor 1 shown in FIG. 14, a sense current flows in the direction intersecting the interfaces between the fixed magnetic layers 7 and the non-magnetic material layers 6 and the interfaces between the non-magnetic material layers 6 and the free magnetic layer 5. Accordingly, it has been believed that the change in resistance by application of an external magnetic field to the magnetic sensor 1 is primarily caused by bulk scattering of conduction electrons of the sense current in the free magnetic layer 5 and the fixed magnetic layer 7. Hence, in the magnetic sensor 1, a larger change in resistance can be obtained as compared to a related current-in-plane type magnetic sensor in which the change in resistance is caused by scattering of sense current electrons at an interface between a free magnetic layer and a non-magnetic material layer or primarily at an interface between the non-magnetic material layer and a fixed magnetic layer. In addition, since the fixed magnetic layer 7 is not provided on the top or the bottom of the free magnetic layer 5, which is a position for detecting a magnetic field, the distance between the top and the bottom shields of the free magnetic layer 5 can be decreased, and hence the decrease in gap can be achieved.

In a magnetic sensor having the structure shown in FIG. 14, when the free magnetic layer 5 and the fixed magnetic layers 7 are not formed to have a large thickness to a certain extent, diffusive scattering of conduction electrons having a longer free mean path (majority electrons, such as, up-spin conduction electrons) quickly occurs at the top or the bottom surfaces of the free magnetic layer 5 and the fixed magnetic layers 7, and as a result, the spin diffusion length (movable distance of electrons while the spin state thereof is maintained) is decreased. Consequently, the change ΔR in resistance is decreased, and a problem in that the reproduction output cannot be increased may arise in some cases.

On the other hand, when the thicknesses of the free magnetic layer 5 and the fixed magnetic layers 7 are increased, the problem described above can be solved; however, since a magnetic moment per unit area of the free magnetic layer 5 is increased, the sensitivity is decreased. In addition, since the exchange coupling magnetic field between the fixed magnetic layer 7 and the antiferromagnetic layer 8 is also decreased, a magnetization fixing force for the fixed magnetic layer 7 is decreased, and as a result, a problem in that the MR properties are degraded may arise.

Accordingly, for example, the structure of a magnetic sensor 1A shown in FIG. 15 has been proposed in which the free magnetic layer 5 is formed to have a synthetic ferrimagnetic structure composed of a first free magnetic material layer 5a, a second free magnetic material layer 5b, and a non-magnetic intermediate layer 5c interposed therebetween for solving the problems such as the decrease in reproduction sensitivity.

However, when the structure shown in FIG. 15 is formed, the following problems occur. For example, as shown in FIG. 15, the first free magnetic material layer 5a and the second free magnetic material layer 5b are magnetized in a direction to the left in the figure (as shown by the arrow) and in a direction to the right in the figure (as shown by the arrow), respectively, and the fixed magnetic layers 7 are magnetized in a height direction (Y direction in the figure). In the case in which an external magnetic field enters the magnetic sensor along the Y direction, when the magnetization of the first free magnetic material layer 5a is rotated in the Y direction shown in the figure, and the magnetization of the second free magnetic material layer 5b is rotated in a direction opposite to the Y direction shown in the figure, a magnetization direction of the first free magnetic material layer 5a and that of the fixed magnetic material layer 7 decrease the resistance, and on the other hand, a magnetization direction of the second free magnetic material layer 5b and that of the fixed magnetic material layer 7 increase the resistance. Hence, the changes in resistance are cancelled out, and as a result, a high rate of change in resistance cannot be obtained. When the fixed magnetic layer 7 is formed to have a synthetic ferrimagnetic structure as described above, the same problems as described above occur.

SUMMARY OF THE INVENTION

Accordingly, the present invention was made to solve the problems described above, and an object of the present invention to provide a magnetic sensor which can improve the rate of change in resistance and also improve properties, such as the reproduction sensitivity and/or the reproduction output, by appropriately forming laminate structures of a free magnetic layer and fixed magnetic layers.

According to the present invention, there is provided a magnetic sensor which comprises: a shield layer; a gap layer provided on the shield layer; a free magnetic layer provided on the gap layer; at least one non-magnetic material layer provided on one side surface of the free magnetic layer; and at least one fixed magnetic layer facing the free magnetic layer through the non-magnetic layer, in which current flows in a direction intersecting an interface between the free magnetic layer and the non-magnetic material layer and an interface between the fixed magnetic layer and the non-magnetic material layer. In the magnetic sensor described above, the free magnetic layer is a laminate composed of a plurality of free magnetic material layers of a magnetic material and at least one first non-magnetic intermediate layer provided therebetween; the fixed magnetic layer is a laminate composed of a plurality of fixed magnetic material layers of a magnetic material and at least one second non-magnetic intermediate layer provided therebetween; and among the magnetic material layers described above, free magnetic material layers and respective fixed magnetic material layers, which are located at equivalent film positions in the respective laminates, face each other in a track width direction.

In the magnetic sensor of the present invention described above, since the free magnetic material layers and the respective fixed magnetic material layers, which are located at equivalent film positions in the respective laminates, face each other in the track width direction, the phase of change in resistance becomes equivalent between the levels on each of which magnetic material layers located at equivalent film positions in the individual laminates are present. Accordingly, the aforementioned problem in that the changes in resistance are cancelled out may not occur, and hence the rate of change in resistance can be increased.

In addition, the magnetic sensor according to the present invention may further comprise: an antiferromagnetic layer provided on the fixed magnetic layer, wherein, among the free magnetic material layers, free magnetic material layers facing each other with the first non-magnetic intermediate layer provided therebetween are preferably magnetized antiparallel to each other in the track width direction, and among the fixed magnetic material layers, fixed magnetic material layers facing each other with the second non-magnetic intermediate layer provided therebetween preferably have fixed magnetizations antiparallel to each other and orthogonal to the magnetizations of the free magnetic material layers.

In the magnetic sensor described above, the free magnetic layer has a ferrimagnetic structure composed of a plurality of free magnetic material layers made of a magnetic material and at least one non-magnetic intermediate layer interposed therebetween. In addition, the fixed magnetic layer has a ferrimagnetic structure composed of a plurality of fixed magnetic material layers made of a magnetic material and at least one non-magnetic intermediate layer interposed therebetween. Since the free magnetic layer and the fixed magnetic layer each have a ferrimagnetic structure, the magnetic moment per effective unit area (saturated magnetization Ms×film thickness t, hereinafter simply referred to as "Ms·t") of the free magnetic layer can be decreased, and hence the reproduction sensitivity can be improved. In addition, by an exchange coupling magnetic field generated between the fixed magnetic layer and the antiferromagnetic layer in combination with an antiparallel coupling magnetic field by the RKKY interaction between the fixed magnetic material layers, a magnetization fixing force for the fixed magnetic layer can be enhanced.

In addition, according to the present invention, it is preferable that, among the magnetic material layers, fixed magnetic material layers be present in film thickness regions in the track width direction of respective free magnetic material layers, which are located at equivalent film positions in the respective laminates, and that fixed magnetic material layers located at film positions different from those of free magnetic material layers be not present in film thickness regions thereof. When the structure described above can be achieved, the phase of the change in resistance effectively becomes equivalent between the levels on each of which magnetic material layers located at equivalent film positions in the individual laminates are present, and as a result, the rate of change in resistance can be improved.

When the non-magnetic material layers and the fixed magnetic layers are provided on two side surfaces of the free magnetic layer, each of the fixed magnetic material layers of the fixed magnetic layer provided on one side of the free magnetic layer and a corresponding one of the fixed magnetic material layers of the fixed magnetic layer provided on the other side of the free magnetic layer, which are located at equivalent film positions of the respective laminates, are preferably magnetized in the same direction. According to the structure described above, at each level of equivalent film positions, the phase of change in resistance between the free magnetic material layer and the corresponding fixed magnetic material layer provided on one side surface of the free magnetic layer is allowed to coincide with the phase of change in resistance between the free magnetic material layer and the respective fixed magnetic material layer provided on the other side of the free magnetic layer. Hence, the rate of change in resistance can be improved.

In addition, in the present invention, among the magnetic material layers, free magnetic material layers and respective fixed magnetic material layer, which are located at equivalent film positions in the respective laminates, preferably have an intrinsic value β of the same positive or the same negative sign.

In this case, the following equation is preferably satisfied: $\rho\downarrow/\rho\uparrow=(1+\beta)/(1-\beta)$, where $-1\leq\beta\leq 1$, $\rho\downarrow$ represents the resistivity to minority conduction electrons of the whole conduction electrons, and $\rho\uparrow$ represents the resistivity to majority conduction electrons.

By the structure described above, a spin diffusion length of electrons of a spin channel in which conduction electrons have a longer a spin diffusion length can be further increased at each level of equivalent film positions, the change ΔR in resistance can be increased, and as a result, the reproduction output can be further improved.

In addition, the magnetic sensor described above may further comprise a specular layer. In this case, the specular layer is preferably provided at at least one of interfaces between the second non-magnetic intermediate layer and the fixed magnetic material layers, which form the fixed magnetic layer, and interfaces between the first non-magnetic intermediate layer and the free magnetic material layers, which form the free magnetic layer, or may be provided in one of the fixed magnetic material layers and the free magnetic material layers.

When the structure is formed as described above, conduction electrons which reach the specular layer are specularly reflected while the spin conditions thereof are maintained, and after changing the moving direction, the conduction electrons are allowed to pass through the fixed magnetic layer and the free magnetic layer. Hence, the spin diffusion length of a conduction electron having a longer spin diffusion length, which improves the magnetoresistance effect, can be increased as compared to that in the past. For example, the difference in free mean path between an up-spin conduction electron and a down-spin conduction electron can be increased, the rate (ΔR/R) of change in resistance can be improved, and hence the reproduction output can be improved.

In addition, it is preferable that the non-magnetic material layers be continuously formed on the two side surfaces of the free magnetic layer and the gap layer, and that the non-magnetic material layers each have a smaller thickness at a position in contact with the upper surface of the gap layer than that at a position in contact with the side surface of the free magnetic layer in the width direction.

By the structure described above, a sense current is not allowed to easily flow through the non-magnetic material layer at the position in contact with the upper surface of the gap layer.

In addition, it is more preferable that the non-magnetic material layers be formed on the two side surfaces of the free magnetic layer and not be formed on the upper surface of the gap, layer.

By the structure described above, a shunt loss of a sense current can be suppressed.

DESCRIPTION OF THE PREFERRED EMBODIMENTS

Figure 1:
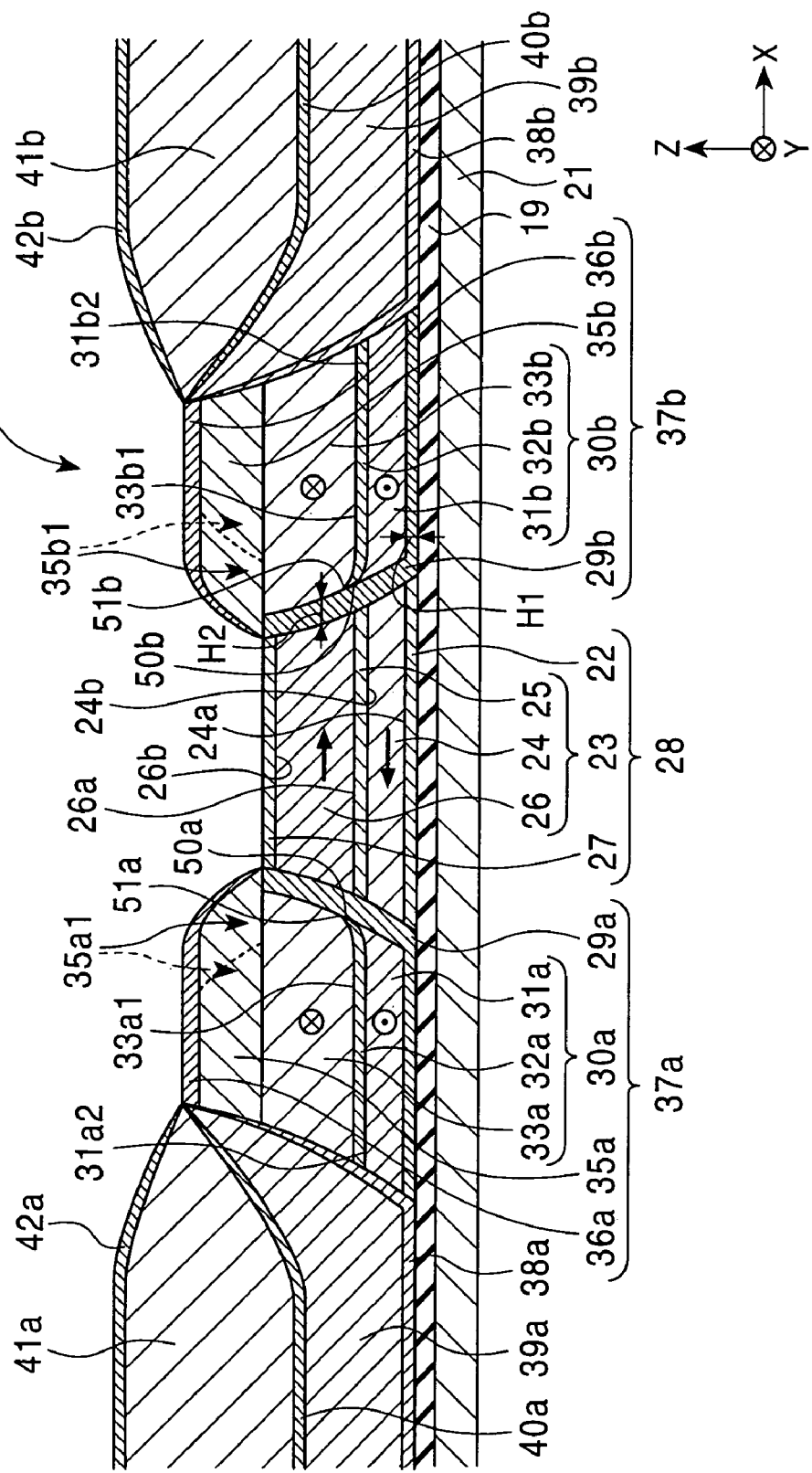
FIG. 1 is a partial cross-sectional view of a magnetic sensor of a first embodiment according to the present invention, when it is viewed from a face opposing a recording medium.

FIG. 1 is a partial cross-sectional view of a magnetic sensor of a first embodiment according to the present invention, when it is viewed from a face opposing a recording medium.

In a magnetic sensor 20 shown in FIG. 1, a lower gap layer 19 made of $Al_2O_3$ or $SiO_2$ is formed on an upper surface of a shield layer 21 made of a magnetic material.

In addition, on the lower gap layer 19 at the center in the figure, a seed layer 22, a free magnetic layer 23, and a protective layer 27 protecting the free magnetic layer 23 are provided in that order.

The free magnetic layer 23 has a three-layered synthetic ferrimagnetic structure composed of a first free magnetic material layer 24, a non-magnetic intermediate layer 25, and a second free magnetic material layer 26 in that order from the shield layer 21 side.

On two side surfaces of a multilayer film 28 in a track width direction (X direction in the figure), which is composed of the seed layer 22, the free magnetic layer 23, and the protective layer 27, and on the upper surface of the lower gap layer 19, non-magnetic material layers 29a and 29b are formed. A thickness H1 of each of the non-magnetic material layers 29a and 29b provided on the upper surface of the lower gap layer 19 is preferably smaller than a thickness H2 of each of the non-magnetic material layers 29a and 29b in contact with the side surfaces of the multilayer film 28 in the track width direction. When the structure is formed as described above, a sense current is not allowed to easily flow through the non-magnetic material layers 29a and 29b at positions in contact with the upper surface of the lower gap layer 19. Accordingly, it is more preferable when the non-magnetic material layers 29a and 29b are only formed on the side surfaces of the multilayer film 28 in the track width direction and are not formed on the upper surface of the lower gap layer 19, and in this case, a shunt of a sense current can be further reduced.

The thickness H2 of each of the non-magnetic material layers 29a and 29b in contact with the side surfaces of the multilayer film 28 in the track width direction is preferably in the range of from 6 to 30 Å, and more preferably, in the range of from 10 to 20 Å. When the thickness of each of the non-magnetic material layers 29a and 29b is reduced as described above, for example, it becomes difficult for conduction electrons to move in an inclined direction, that is, conduction electrons of a sense current are not allowed to easily flow from a first fixed magnetic material layer 31a to the second free magnetic material layer 26 or from a second fixed magnetic material layer 33a to the first free magnetic material layer 24, and hence the rate of change in resistance can be improved.

On the non-magnetic material layers 29a and 29b, fixed magnetic layers 30a and 30b are formed, respectively.

The fixed magnetic layer 30a has a synthetic ferrimagnetic structure composed of the first fixed magnetic material layer 31a, a non-magnetic intermediate layer 32a made of Ru or the like, and the second fixed magnetic material layer 33a in that order from the shield layer 21 side. The fixed magnetic layer 30b has the same synthetic ferrimagnetic structure as described above composed of a first fixed magnetic material layer 31b, a non-magnetic intermediate layer 32b, and a second fixed magnetic material layer 33b.

An upper surface 31a2 of the first fixed magnetic material layer 31a is curved in a Z direction in the figure in the vicinity of a contact portion 50a with the non-magnetic material layer 29a, and an upper surface 31b2 of the first fixed magnetic material layer 31b is also curved as described above in the vicinity of a contact point 50b with the non-magnetic material layer 29b. Accordingly, the non-magnetic intermediate layers 32a and 32b formed on the first fixed magnetic material layers 31a and 31b, respectively, are also curved as described above. In addition, a lower surface 33a1 of the second fixed magnetic material layer 33a is also curved in the Z direction shown in the figure in the vicinity of a contact portion 51a with the non-magnetic material layer 29a. Furthermore, a lower surface 33b1 of the second fixed magnetic material layer 33b is also curved as described above in the vicinity of a contact portion 51b with the non-magnetic material layer 29b.

On the second fixed magnetic material layers 33a and 33b, antiferromagnetic layers 35a and 35b are formed, respectively, and over the antiferromagnetic layers 35a and 35b, respective protective layers 36a and 36b are formed. An inside front portion 35a1 of the antiferromagnetic layer 35a and an inside front portion 35b1 of the antiferromagnetic layer 35b may extend to the respective upper surfaces of the non-magnetic material layers 29a and 29b, and in addition, as shown by dotted lines in FIG. 1, the inside front portions 35a1 and 35b1 of the respective antiferromagnetic layers 35a and 35b may be each placed at a position apart from the free magnetic layer 23 in the track width direction. In both cases described above, the magnetizations of the second fixed magnetic material layer 33a and the first fixed magnetic material layer 31a can be fixed, and in addition, the magnetizations of the second fixed magnetic material layer 33b and the first fixed magnetic material layer 31b can also be fixed. In addition, when the inside front portions 35a1 and 35b1 of the respective antiferromagnetic layers 35a and 35b are each placed at a position apart from the free magnetic layer 23 in the track width direction, a shunt loss of a sense current can be reduced A bias underlayer 38a made of Cr or the like is continuously formed on a side portion of a multilayer film 37a in the track width direction and on the upper surface of the lower gap layer 19, which multilayer film 37a is formed of the non-magnetic material layer 29a, the fixed magnetic layer 30a, the antiferromagnetic layer 35a, and the protective layer 36a. A bias underlayer 38b made of Cr or the like is also continuously formed on a side portion of a multilayer film 37b in the track width direction and on the upper surface of the lower gap layer 19, which multilayer film 37b is formed of the non-magnetic material layer 29b, the fixed magnetic layer 30b, the antiferromagnetic layer 35b, and the protective layer 36b. In addition, on the bias underlayers 38a and 38b, hard magnetic layers (hard bias layers) 39a and 39b are provided, respectively. Furthermore, on the hard bias layer 39a, an electrode layer 41a is formed with a non-magnetic spacer layer 40a provided therebetween, and over the electrode layer 41a, a protective layer 42a is formed. At the same time, the same structure as described above is formed from the hard bias layer 39b, an electrode layer 41b, a non-magnetic spacer layer 40b, and a protective layer 42b.

The seed layer 22 may be formed, for example, of Cr, an NiFe alloy, or an Ni—Fe—Y ally (where Y is at least one selected from the group consisting of Cr, Rh, Ta, Hf, Nb, Zr, and Ti). This seed layer 22 is formed to have a thickness of approximately 30 Å. However, without forming the seed layer 22, the magnetic sensor described above may be formed in some cases.

The first free magnetic material layer 24 and the second free magnetic material layer 26, which form the free magnetic layer 23, are formed of a magnetic material, and by vertical bias magnetic fields from the hard magnetic layers 39a and 39b which are magnetized in the track width direction, the magnetization of one of the first free magnetic material layer 24 and the second free magnetic material layer 26, whichever has a higher magnetic moment per unit area (saturated magnetization Ms×film thickness t, hereinafter simply referred to as "Ms·t"), is aligned in the same direction as that of the vertical bias magnetic field, for example, in the X direction shown in the figure, and the magnetization of the other free magnetic material layer having a smaller Ms·t is aligned in a direction antiparallel to the X direction in the figure. That is, the magnetization of the first free magnetic material layer 24 and that of the second free magnetic material layer 26 are in the antiparallel state.

For example, in FIG. 1, Ms·t of the second free material magnetic layer 26 is larger than that of the first free magnetic material layer 24, and hence the magnetization of the second free magnetic material layer 26 is aligned in the X direction in the figure. In addition, by the RKKY interaction working between the free magnetic materials layers, the magnetization of the first free magnetic material layer 24 is aligned in the direction antiparallel to the X direction in the figure.

An integrated magnetic moment per unit area of the free magnetic layer 23 is the difference in Ms·t between the first free magnetic material layer 24 and the second free magnetic material layer 26. Accordingly, in the case in which the free magnetic layer 23 has a synthetic ferrimagnetic structure as this embodiment, even when the free magnetic layer 23 is formed to have a large thickness, substantial Ms·t of the free magnetic layer 23 can be reduced, and hence magnetic field detection sensitivity and reproduction output of the magnetic sensor can be improved.

Both the first free magnetic material layer 24 and the second free magnetic material layer 26 are formed from a magnetic material, and magnetic materials, such as a CoFe alloy, Co, a CoNiFe alloy, a CoNi alloy, and a NiFe alloy, may be used. The non-magnetic intermediate layer 25 is formed of a non-magnetic material, such as Ru, Rh, Ir, Cr, Re, Cu, or an alloy containing at least two metals mentioned above, and in particular, Ru is preferably used. In addition, the protective layer 27 is formed of Ru, Ta, or the like.

The non-magnetic material layers 29a and 29b are formed of Cu or the like.

The first fixed magnetic material layers 31a and 31b and the second fixed magnetic material layers 33a and 33b, which form the fixed magnetic layers 30a and 30b, respectively, are formed of a magnetic material. As is the free magnetic layer 23, since the fixed magnetic layers 30a and 30b also each have a synthetic ferrimagnetic structure, the magnetizations of the first fixed magnetic material layers 31a and 31b are fixed in a direction opposite to a Y direction in the figure, and on the other hand, the magnetizations of the second fixed magnetic material layers 33a and 33b are fixed in the Y direction in the figure. Hence, the magnetization of the first fixed magnetic material layer 31a and the magnetization of the second fixed magnetic material layer 33a are antiparallel to each other, and the magnetization of the first fixed magnetic material layer 31b and the magnetization of the second fixed magnetic material layer 33b are also antiparallel to each other.

The first fixed magnetic material layers 31a and 31b and the second fixed magnetic material layers 33a and 33b are formed of a magnetic material., such as an NiFe alloy, Co, a CoNiFe alloy, a CoFe alloy, or a CoNi alloy. In addition, the non-magnetic intermediate layer 32a and 32b are formed of a non-magnetic material selected from the group consisting of Ru, Rh, Ir, Cr, Re, Cu, or an alloy containing at least two metals mentioned above, and in particular, Ru is preferably used.

The antiferromagnetic layers 35a and 35b are formed of a PtMn alloy, an X—Mn alloy (where X is at least one element selected from the group consisting of Pd, Ir, Rh, Ru, Os, Ni, and Fe), or a Pt—Mn—X' alloy (where X is at least one element selected from the group consisting of Pd, Ir, Rh, Ru, Au, Ag, Os, Cr, Ni, Ar, Ne, Xe, and Kr). In addition, the protective layers 36a and 36b may be formed of Ru, Ta, or the like.

When the alloys mentioned above are used for the antiferromagnetic layers 35a and 35b and are processed by heat treatment, exchange coupling magnetic films, each of which generates a large exchange coupling magnetic field, are formed of the antiferromagnetic layer 35a with the fixed magnetic layer 30a and of the antiferromagnetic layer 35b with the fixed magnetic layer 30b. In particular, when a PtMn alloy is used, superior exchange coupling films can be obtained from the antiferromagnetic layers 35a and 35b and respective fixed magnetic layers 30a and 30b, each of which has an exchange coupling magnetic field of 48 kA/m or more, such as more than 64 kA/m, and a significantly high blocking temperature of 380° C. at which the exchange coupling magnetic field is lost. These alloys each have an irregular face-centered cubic structure (fcc) right after the film is formed and by heat treatment, the structure is then transformed into a CuAuI type regular face-centered tetragonal structure (fct).

The bias underlayers 38a and 38b are provided for improving the properties (coercive force Hc and squareness ratio S) of the respective hard magnetic layers 39a and 39b and are formed of Cr or the like.

The hard magnetic layers 39a and 39b are magnetized in the track width direction and are formed, for example, of a CoPt alloy or a CoPtCr alloy.

The spacer layers 40a and 40b formed on the respective hard magnetic layers 39a and 39b are formed of Ta, Cr, or the like.

The electrode layers 41a and 41b formed on the respective spacer layers 40a and 40b may be formed of Au, W, Ta, Cr, Rh, or the like, and the protective layers 42a and 42b for protecting the respective electrode layers 41a and 41b may be formed of Ta or the like.

In the magnetic sensor 20, current flows from one electrode layer 41a to the other electrode layer 41b, and in this step, the current flows in a direction intersecting interfaces between the free magnetic layer 23 and the non-magnetic material layers 29a and 29b, an interface between the fixed magnetic layer 30a and the non-magnetic material layer 29a, and an interface between the fixed magnetic layer 30b and the non-magnetic material layer 29b.

Hereinafter, the features of the magnetic sensor 20 will be described.

As shown in FIG. 1, in the magnetic sensor 20, the free magnetic layer 23 and the fixed magnetic layers 30a and 30b are each have a synthetic ferrimagnetic structure, and the first free magnetic material layer 24 and the first fixed magnetic material layers 31a and 31b, which are located at the equivalent film positions, are formed so as to face each other in the track width direction (X direction in the figure). In addition, the second free magnetic material layer 26 and the second fixed magnetic material layers 33a and 33b, which are located at the equivalent film positions, are also formed so as to face each other in the track width direction.

In addition, since the free magnetic layer 23 has a synthetic ferrimagnetic structure, the first free magnetic material layer 24 and the second free magnetic material layer 26, which form the free magnetic layer 23, are magnetized antiparallel to each other. In addition, since the fixed magnetic layers 30a and 30b each have a synthetic ferrimagnetic structure, the first fixed magnetic material layer 31a and the second fixed magnetic material layer 33a have fixed magnetizations antiparallel to each other, and the first fixed magnetic material layer 31b and the second fixed magnetic material layer 33b also have fixed magnetizations antiparallel to each other. In this case, the first fixed magnetic material layer 31a of the fixed magnetic layer 30a formed on the left side of the free magnetic layer 23 in the figure and the first fixed magnetic material layer 31b of the fixed magnetic layer 30b formed on the right side of the free magnetic layer 23 in the figure have fixed magnetizations aligned in the same direction, and the second fixed magnetic material layer 33a and the second fixed magnetic material layer 33b also have fixed magnetizations aligned in the same direction.

When the laminate structures of the free magnetic layer 23 and the fixed magnetic layers 30a and 30b are formed as described above with reference to FIG. 1, conduction electrons are allowed to easily flow through the fixed magnetic material layers and the respective free magnetic material layer, which are located at equivalent film positions, in the track width direction, and the change in magnetization between the fixed magnetic material layers and the respective free magnetic material layer becomes equivalent between the levels on each of which magnetic material layers located at equivalent film positions in the individual laminates are present. Accordingly, a problem in that the changes in resistance are cancelled out can be suppressed, and as a result, the rate of change in resistance can be improved.

Figure 2:
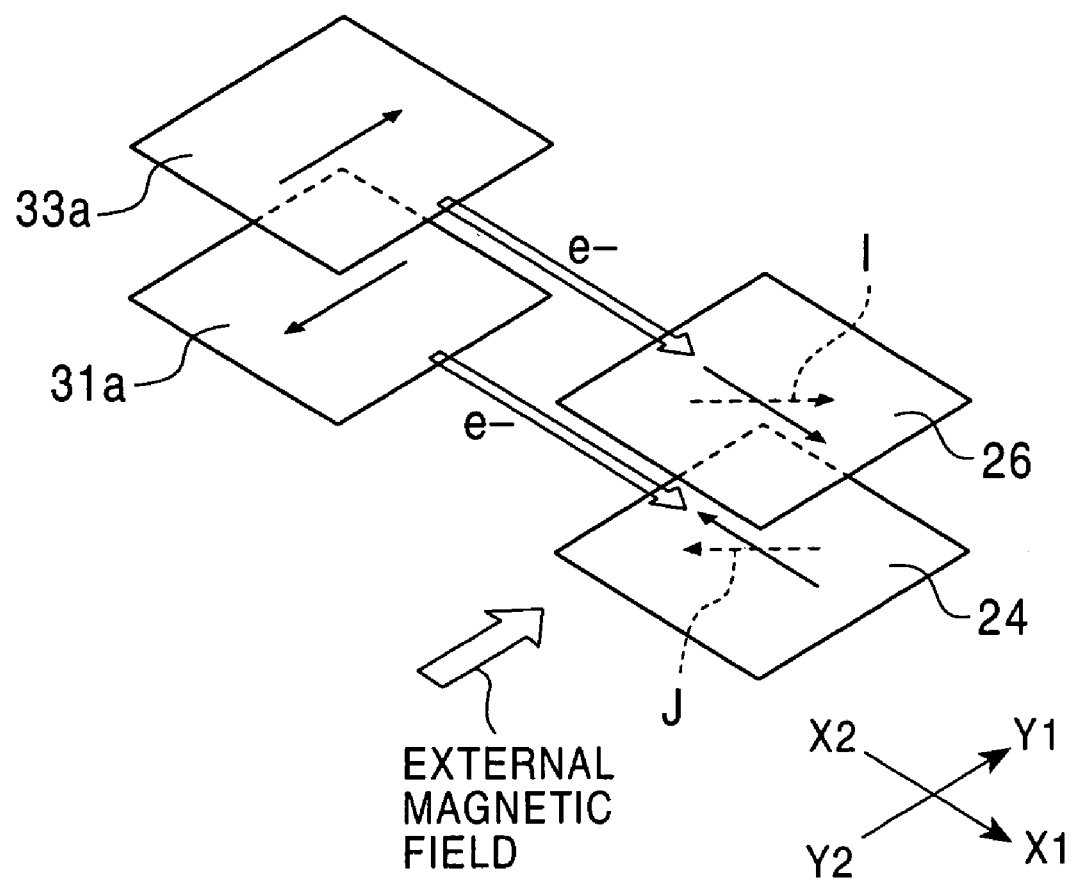
FIG. 2 is a schematic perspective view of the magnetic sensor shown in FIG. 1 when it is viewed diagonally from above.

FIG. 2 is a schematic view showing the first free magnetic material layer 24, the second free magnetic material layer 26, the first fixed magnetic material layer 31a, and the second fixed magnetic material layer 33a shown in FIG. 1 together with magnetization directions thereof, the first and the second fixed magnetic material layers 33a and 33b being located at the left side of the free magnetic layer 23 shown in the figure. FIG. 2 shows the individual layers described above when viewed diagonally from above.

As shown in FIG. 2, the magnetization of the second fixed magnetic material layer 33a is fixed in a Y1 direction in the figure. On the other hand, the magnetization of the second free magnetic material layer 26 is fixed in an X1 direction which is orthogonal to the magnetization of the second fixed magnetic material layer 33a.

In addition, the magnetization of the first fixed magnetic material layer 31a is fixed in a Y2 direction in the figure which is opposite to the magnetization of the second fixed magnetic material layer 33a. On the other hand, the first free magnetic material layer 24 is magnetized in an X2 direction which is orthogonal to the magnetization of the first fixed magnetic material layer 31a and opposite to the magnetization of the second free magnetic material layer 26.

When an external magnetic field is applied from a recording medium in the arrow direction (Y1 direction in the figure), the second free magnetic material layer 26 having a larger Ms·t tends to be magnetized in the same direction as that of the external magnetic field, and as a result, the magnetization of the second free magnetic material layer 26 is rotated as shown by arrow I. In addition, the first free magnetic material layer 24 having a smaller Ms·t tends to maintain the magnetization thereof antiparallel to that of the second free magnetic material layer 26, and as a result, the magnetization of the first free magnetic material layer 24 is rotated as shown by arrow J.

When a conduction electron (e⁻ shown in the figure) flows from the second fixed magnetic material layer 33a to the second free magnetic material layer 26, which are located at the equivalent film positions, via the non-magnetic material layer 29a, since the magnetization of the second free magnetic material layer 26 is rotated as shown by the arrow I, the electrical resistance is decreased, and in addition, when a conduction electron (e⁻ shown in the figure) flows from the first fixed magnetic material layer 31a to the first free magnetic material layer 24, which are located at the equivalent film positions, via the non-magnetic material layer 29a, since the magnetization of the first free magnetic material layer 24 is rotated as shown by the arrow J, the electrical resistance is also decreased. As described above, since the change in magnetization between the fixed magnetic material layer and the respective free magnetic material layer becomes equivalent between the levels on each of which magnetic material layers located at equivalent film positions of respective laminates are present, an existing problem in that the changes in resistance are cancelled out can be suppressed, and as a result, the rate of change in resistance can be improved.

Although not explained in FIG. 2, by the change in magnetization between the first free magnetic material layer 24 and the first fixed magnetic material layer 31b of the fixed magnetic layer 30b formed at the right side of the free magnetic layer 23, and also by the change in magnetization between the second free magnetic material layer 26 and the second fixed magnetic material layer 33b, the electrical resistance is decreased. Accordingly, a problem in that the changes in resistance are cancelled out may not arise, and the rate of change in resistance can be more effectively improved.

In the present invention, as described above, the first fixed magnetic material layers 31a and 31b and the first free magnetic material layer 24, which are located at the equivalent film positions, are formed to face each other in the track width direction, and the second fixed magnetic material layers 33a and 33b and the second free magnetic material layer 26, which are located at the equivalent film positions, are also formed to face each other in the track width direction. As for the degree of overlap between the fixed magnetic material layer and the free magnetic material layer, which are located at equivalent film positions, the fixed magnetic material layer preferably overlaps 50% to 150% of the free magnetic material layer with respect to the thickness thereof. When the degree of overlap is out of the range mentioned above, the number of conduction electrons flowing through the fixed magnetic material layers and the free magnetic material layer, which are located at equivalent film positions, in the track width direction is decreased, and in addition, the number of conduction electrons flowing through magnetic material layers located at different film positions is increased. Hence, the ratio of resistance which is cancelled out is increased, and as a result, the rate of change in resistance is decreased.

Accordingly, it is more preferable that, in the thickness regions of the first free magnetic material layer 24 and the second free magnetic material layer 26, which form the free magnetic layer 23, fixed magnetic material layers located at film positions equivalent to those of the respective free magnetic material layers be present, and that fixed magnetic material layers located at film positions different from that of the respective free magnetic material layers be not present.

Accordingly, when the magnetic material layers are formed, the thicknesses of a free magnetic material layer and respective fixed magnetic material layers, which are located at equivalent film positions, are adjusted so that the lower surfaces thereof coincide with each other in the track width direction (X direction in the figure) and that the upper surfaces thereof coincide with each other in the track width direction.

In addition, in the magnetic sensor 20 described above, the contact portions 50a and 50b and the upper surface 24b of the first free magnetic material layer 24 may be formed to have heights equivalent to each other in the Z direction in the figure, and the contact portions 51a and 51b and the lower surface 26a of the second free magnetic material layer 26 may be formed to have heights equivalent to each other in the Z direction in the figure. In a magnetic sensor having the structure described above, for example, a conduction electron having a smaller spin diffusion length is not allowed to easily flow through between a free magnetic material layer and a fixed magnetic material layer, which are located at film positions different from each other, and as a result, the ratio of resistance which is cancelled out can be suppressed.

In addition, in the magnetic sensor 20 shown in FIG. 1, since the free magnetic layer 23 has a synthetic ferrimagnetic structure, even when the thickness of the free magnetic layer 23 is increased, an effective Ms·t can be decreased, and the change ΔR in resistance and the output sensitivity can be improved. The first free magnetic material layer 24 and the second free magnetic material layer 26 preferably have a thickness of 30 to 200 Å.

In addition, in the magnetic sensor 20 shown in FIG. 1, since the fixed magnetic layer 30a has a synthetic ferrimagnetic structure, even when the thickness of the fixed magnetic layer 30a is increased, the thickness of the fixed magnetic material layer 33a in contact with the antiferromagnetic layer 35a can be decreased. Hence, an exchange coupling magnetic field Hex generated between the antiferromagnetic layer 35a and the second fixed magnetic material layer 33a can be increased, the change ΔR in resistance can be improved, and the fixed magnetic layer 30a can be tightly magnetically fixed. The same advantages as described above can also be obtained for the fixed magnetic layer 30b by the same structure as that of the fixed magnetic layer 30a, which is composed of the antiferromagnetic layer 35b and the second fixed magnetic material layer 33b.

Next, in the magnetic sensor 20 shown in FIG. 1, the free magnetic material layer and the fixed magnetic material layers, which are located at equivalent film positions, preferably has β of the same positive or the same negative sign. In the present invention, β is an intrinsic value of a magnetic material which satisfies the relationship represented by $\rho\downarrow/\rho\uparrow = (1+\beta)/(1-\beta)$ (where $-1 \leq \beta \leq 1$), in which $\rho\downarrow$ represents the resistivity to minority conduction electrons of the whole conduction electrons and $\rho\uparrow$ represents the resistivity to majority conduction electrons.

In order to increase the change ΔR in resistance of the magnetic sensor, when the magnetizations of fixed magnetic material layers and a free magnetic material layer, which are located at equivalent film positions, are parallel to each other, for example, the resistance to up-spin conduction electrons is preferably smaller than that to down-spin conduction electrons at the level of the above equivalent film positions. Alternatively, in all the magnetic material layers, the resistance to down-spin conduction electrons is preferably smaller than that to up-spin conduction electrons.

For example, when the first fixed magnetic material layers 31a and 31b and the first free magnetic material layer 24 are formed of a magnetic material having β of positive value, in the first fixed magnetic material layers 31a and 31b and the first free magnetic material layer 24, majority conduction electrons (for example, up-spin electrons) become likely to flow, and on the other hand, minority conduction electrons (for example, down-spin electrons) become unlikely to flow. As a result, when the magnetizations of the layers described above are parallel to each other, in the first fixed magnetic material layers 31a and 31b and the first free magnetic material layer 24, the resistance to up-spin conduction electrons becomes smaller than that to down-spin conduction electrons. On the other hand, when an approximately antiparallel state is formed by application of an external magnetic field, up-spin conduction electrons become unlikely to flow in the first free magnetic material layer 24. As a result, the difference in ease of flow between conduction electrons in a low resistance state and those in a high resistance state can be increased, and hence the change ΔR in resistance can be increased.

In addition, all the magnetic material layers, that is, the first fixed magnetic material layers 31a and 31b, the first free magnetic material layer 24, the second fixed magnetic material layers 33a and 33b, and the second free magnetic material layer 26, may be formed of a magnetic material having β of positive value or negative value.

For example, when all the magnetic material layers, that is, the first fixed magnetic material layers 31a and 31b, the first free magnetic material layer 24, the second fixed magnetic material layers 33a and 33b, and the second free magnetic material layer 26, are formed of a material having β of positive value, and when majority conduction electrons of the first fixed magnetic material layers 31a and 31b and the first free magnetic material layer 24 are up-spin conduction electrons, majority conduction electrons of the second fixed magnetic material layers 33a and 33b and the second free magnetic material layer 26 are down-spin conduction electrons. In the case described above, when the magnetizations of the first fixed magnetic material layers 31a and 31b and the first free magnetic material layer 24, which are located at the equivalent film positions, are parallel to each other, the resistance to up-spin conduction electrons can be smaller than that to down-spin conduction electrons. In addition, when the magnetizations of the second fixed magnetic material layers 33a and 33b and the second free magnetic material layer 26, which are located at the equivalent film positions, are parallel to each other, the resistance to down-spin conduction electrons can be smaller than that to up-spin conduction electrons. Hence, it is believed that at each level of equivalent film positions, the difference in ease of flow between conduction electrons in a low resistance state and those in a high resistance state can be increases. Hence, the change ΔR in resistance can be increased.

As a material having β of positive value, for example, there may be mentioned an NiX alloy (where X is one element selected from the group consisting of Co, Fe, Mn, Zr, Hf, Cu, and Au), a CoT alloy (where T is one element selected from the group consisting of Fe, Zr, Ta, and Hf), an FeZ alloy (where Z is one element selected from the group consisting of Ni, Co, Rh, Pt, Ir, Be, Al, Si, Ga, and Ge), or a Co—Mn-D alloy (where D is one element selected from the group consisting of Al, Ga, Si, Ge, and Sn). In addition, as a material having β of negative value, for example, there may be mentioned an NiM alloy (where M is one element selected from the group consisting of Cr, Rh, Ru, Mo, Nb, Pt, Ir, Os, Re, W, and Ta), a CoQ alloy (where Q is one element selected from the group consisting of Mn, Cr, Ru, Mo, Ir, Os, Re, and W), or an FeA alloy (where A is one element selected from the group consisting of Mn, Cr, V, Ti, Ru, Mo, Os, Re, and W).

Figure 3:
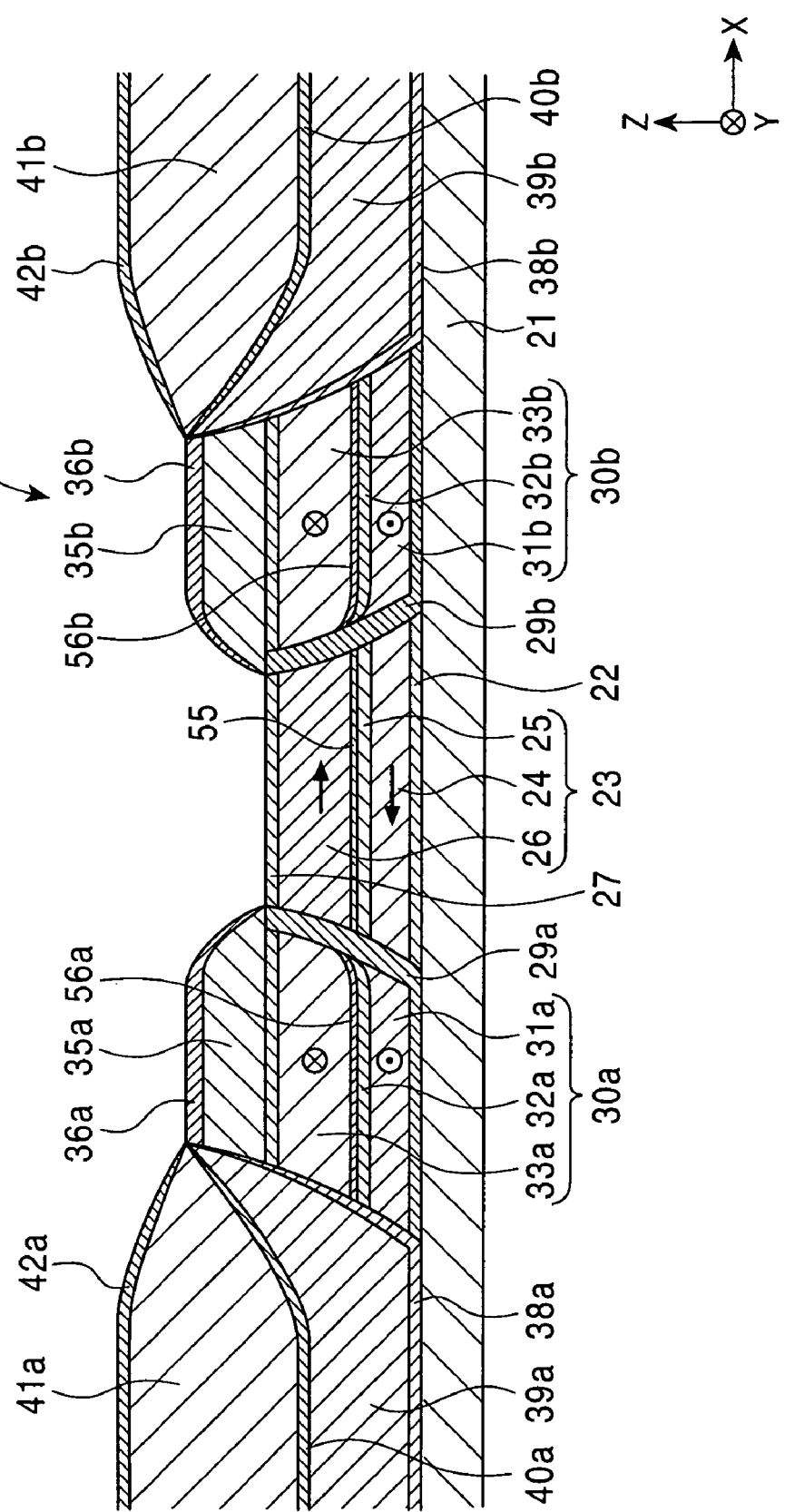
FIG. 3 is a partial cross-sectional view of a magnetic sensor of a second embodiment according to the present invention, when it is viewed from a face opposing a recording medium.

FIG. 3 is a schematic view of a magnetic sensor 20A of a second embodiment according to the present invention. The same reference numerals of the constituent elements of the magnetic sensor 20 shown in FIG. 1 designate the same constituent elements of the magnetic sensor 20A, and detailed description thereof will be omitted.

In the magnetic sensor 20A shown in FIG. 3, a specular layer 55 is formed between the non-magnetic intermediate layer 25 and the second free magnetic material layer 26. According to the structure described above, conduction electrons incident on the specular layer 55 are specularly reflected while the spin conditions thereof are maintained. Hence, after changing the moving direction thereof, the conduction electrons are allowed to pass through the free magnetic layer 23 and the fixed magnetic layers 30a and 30b, and the spin diffusion length can be increased, thereby improving the change ΔR in resistance.

As a material for the specular layer 55, for example, there may be mentioned an oxide such as Fe—O, Ni—O, Co—O, Co—Fe—O, Co—Fe—Ni—O, Al—O, Al-Q-O (where Q is at least one selected from the group consisting of B, Si, N, Ti, V, Cr, Mn, Fe, Co, and Ni), or R—O (where R is at least one selected from the group consisting of Cu, Ti, V, Cr, Zr, Nb, Mo, Hf, Ta, and W); a nitride such as Al—N, Al-Q-N (where Q is at least one selected from the group consisting of B, Si, O, Ti, V, Cr, Mn, Fe, Co, and Ni), or R—N (where R is at least one selected from the group consisting of Ti, V, Cr, Zr, Nb, Mo, Hf, Ta, and W); or a semi-metal Heusler alloy.

In addition, specular layers 56a and 56b may be formed between the non-magnetic intermediate layer 32a and the second fixed magnetic material layer 33a and between the non-magnetic intermediate layer 32b and the second fixed magnetic material layer 33b, respectively. By the structure described above, conduction electrons incident on the specular layer 56a and 56b are specularly reflected while the spin conditions thereof are maintained and, after changing the moving direction, are allowed to pass through the fixed magnetic layers 30a and 30b and the free magnetic layer 23. Hence the spin diffusion length can be increased, and the change ΔR in resistance can be improved. A material for the specular layers 56a and 56b may be selected from the materials described above.

The specular layers described above may also be provided between the first free magnetic material layer 24 and the non-magnetic intermediate layer 25, between the first fixed magnetic material layer 31a and the non-magnetic intermediate layer 32a, and/or between the first fixed magnetic material layer 31b and the non-magnetic intermediate layer 32b.

In addition to or instead of the specular layers provided in the free magnetic layer 23 and/or the fixed magnetic layers 30a and 30b, the specular layers may be provided directly or indirectly on the upper or the lower surface of the free magnetic layer 23, and/or the upper and the lower surfaces of the fixed magnetic layers 30a and 30b.

When at least one specular layer is provided at one of the positions described above, the advantage described above can be obtained.

Figure 4:
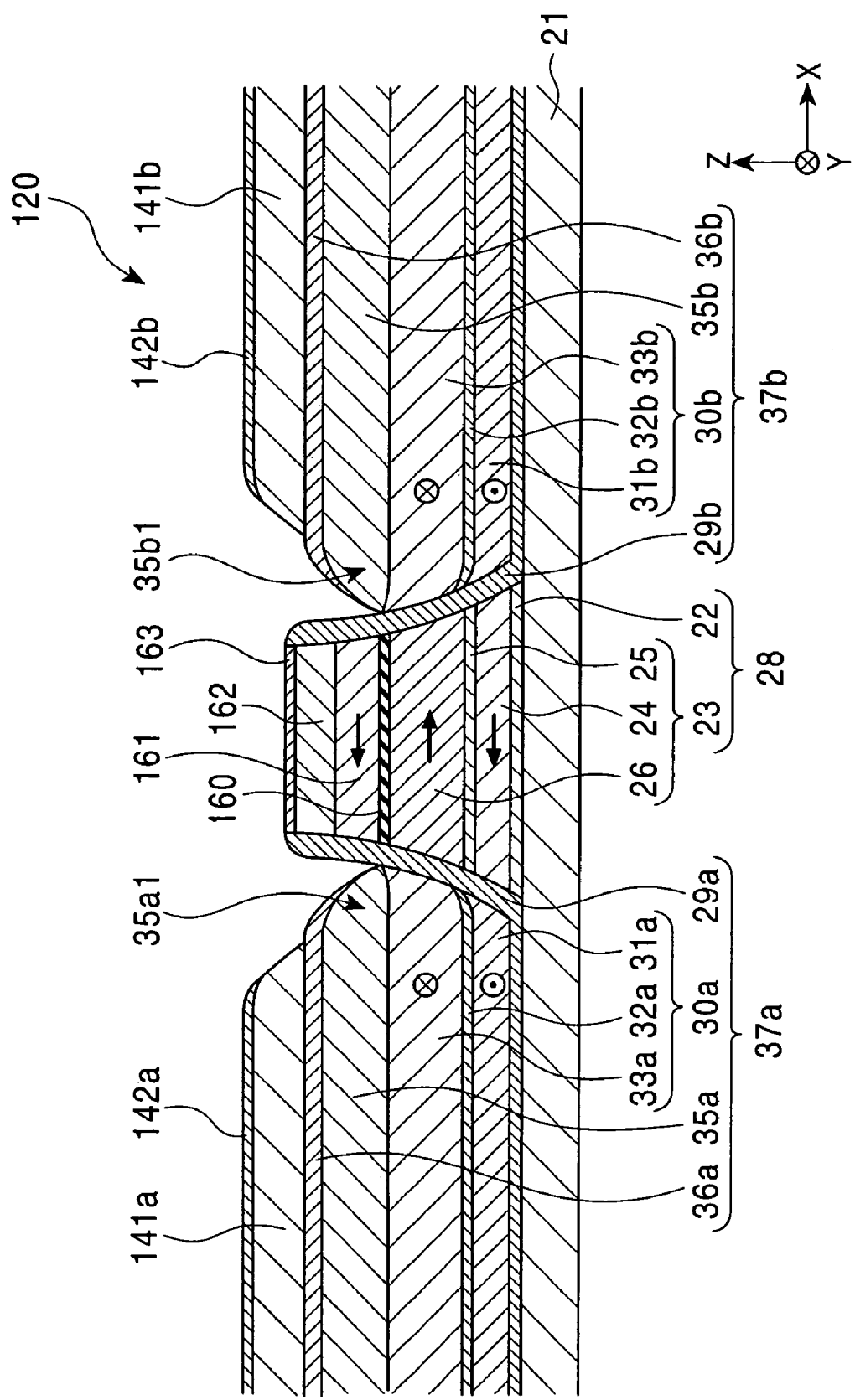
FIG. 4 is a partial cross-sectional view of a magnetic sensor of a third embodiment according to the present invention, when it is viewed from a face opposing a recording medium.

FIG. 4 is a partial cross-sectional view of a magnetic sensor of a third embodiment according to the present invention, when it is viewed from a face opposing a recording medium.

A magnetic sensor 120 shown in FIG. 4 has the structure equivalent to that of the magnetic sensor 20 shown in FIG. 1. Accordingly, the same reference numerals of the constituent elements of the magnetic sensor 20 designate the same constituent elements of the magnetic sensor 120, and detailed descriptions thereof will be omitted.

As shown in FIG. 4, in the magnetic sensor 120, on the second fixed magnetic material layer 33a, the antiferromagnetic layer 35a is formed, and an electrode layer 141a composed of Au, W, Cu, Cr, Ta, Rh, or the like is formed on the antiferromagnetic layer 35a with the protective layer 36a provided therebetween at a distance from the inside front portion 35a1 in the track width direction. In addition, the second fixed magnetic material layer 33b, the antiferromagnetic layer 35b, an electrode layer 141b composed of Au, W, Cu, Cr, Ta, Rh, or the like, and the protective layer 36b also form the same structure as described above. Protective layers 142a and 142b made of Ta or the like are formed on the respective electrode layers 141a and 141b for covering thereof.

In the magnetic sensor 120, since a method for applying a vertical bias magnetic field to the free magnetic layer 23 is different from that in the magnetic sensor 20, there are some structural differences therebetween. As shown in FIG. 4, in the magnetic sensor 120, on the second free magnetic material layer 26, a soft magnetic material layer 161 is formed with an insulating material layer 160 made of an insulating material provided therebetween, and on this soft magnetic material layer 161, an antiferromagnetic layer 162 is formed. In addition, on this antiferromagnetic layer 162, a protective layer 163 made of Ru, Ta, or the like is provided for protection.

The magnetization of the soft magnetic material layer 161 is fixed in a direction opposite to the X direction in the figure by an exchange coupling magnetic field Hex generated at an interface formed with the antiferromagnetic layer 162.

By magnetostatic coupling generated with the end of the soft magnetic material layer 161, the magnetization of which is fixed, through the insulating layer 160, the magnetization of the second free magnetic material layer 26 is aligned in the X direction in the figure. In addition, since the magnetization of the second free magnetic material layer 26 must not be fixed, the thickness thereof is formed larger than that of the soft magnetic material layer 161 so that the magnetization of the second free magnetic material layer 26 is not fixed by the magnetostatic coupling. However, when the thickness of the insulating layer 160 is large, the soft magnetic material layer 161 may have a thickness larger than that of the second free magnetic material layer 26. As a result, the magnetization of the first free magnetic material layer 24 is aligned in the direction opposite to the X direction in the figure by the RKKY interaction generated with the second free magnetic material layer 26.

As described above, by the structure of the magnetic sensor 120, a vertical bias magnetic field can be applied to the free magnetic layer 23, and hence the free magnetic layer 23 can be placed in a single domain state.

The soft magnetic material layer 161 may be formed of a soft magnetic material, such as an NiFe alloy, Co, a CoNiFe alloy, a CoFe alloy, or a CoNi alloy.

The antiferromagnetic layer 162 is formed of a PtMn alloy, an X—Mn alloy (where X is at least one element selected from the group consisting of Pd, Ir, Rh, Ru, Os, Ni, and Fe), or a Pt—Mn—X' alloy (where X' is at least one element selected from the group consisting of Pd, Ir, Rh, Ru, Au, Ag, Os, Cr, Ni, Ar, Ne, Xe, and Kr). In addition, the protective layers 142a, 142b, and 163 may be formed of Ru, Ta, or the like.

Figure 5:
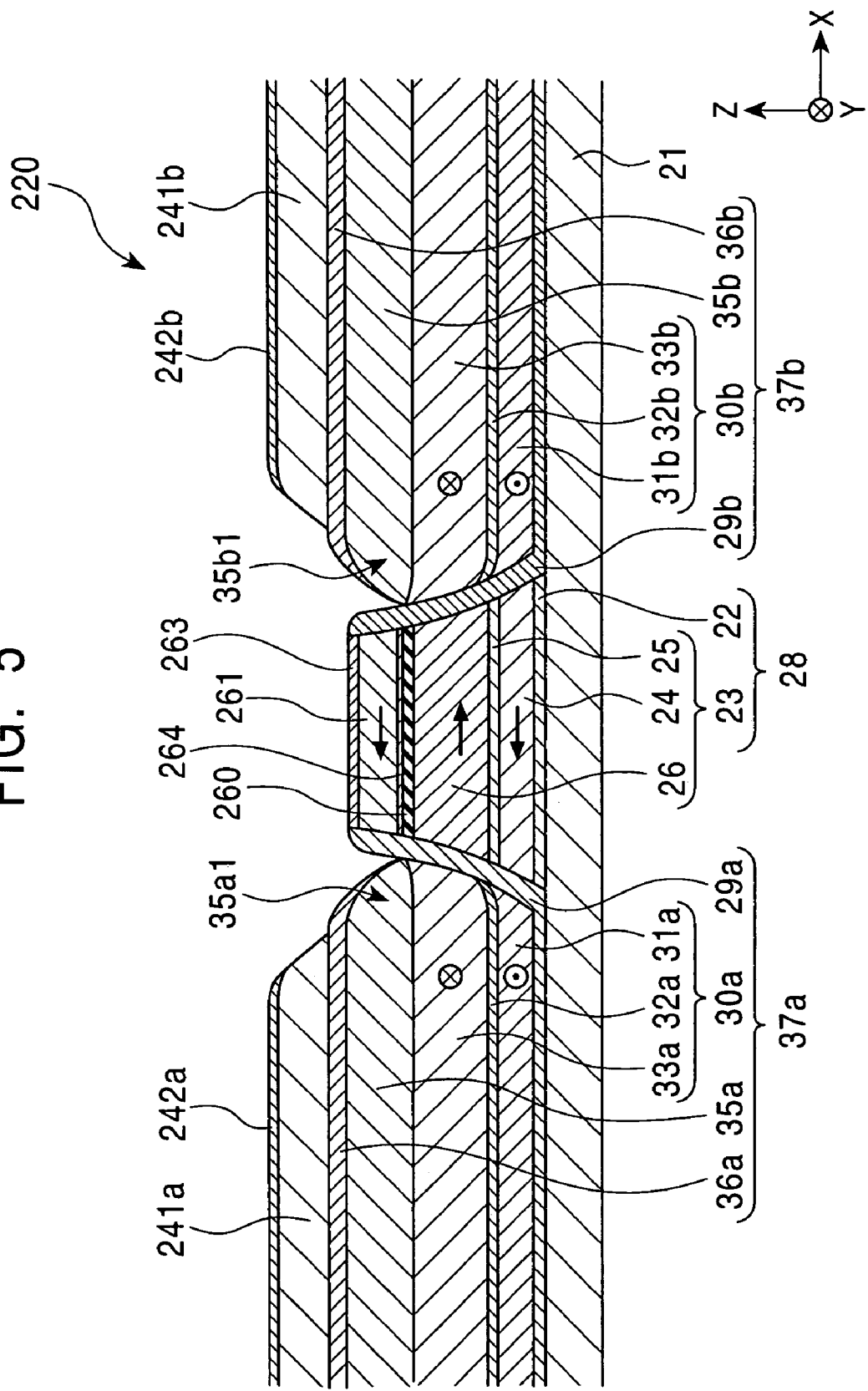
FIG. 5 is a partial cross-sectional view of a magnetic sensor of a fourth embodiment according to the present invention, when it is viewed from a face opposing a recording medium.

FIG. 5 is a partial cross-sectional view of a magnetic sensor of a fourth embodiment according to the present invention, when it is viewed from a face opposing a recording medium.

A magnetic sensor 220 shown in FIG. 5 has the structure equivalent to that of the magnetic sensor 20 shown in FIG. 1. Accordingly, the same reference numerals of the constituent elements of the magnetic sensor 20 shown in FIG. 1 designate the same constituent elements of the magnetic sensor 220, and detailed descriptions thereof will be omitted.

As shown in FIG. 5, in the magnetic sensor 220, as is the magnetic sensor 120 shown in FIG. 4, on the second fixed magnetic material layer 33a, the antiferromagnetic layer 35a is formed, and an electrode layer 241a composed of Au, W, Cu, Cr, Ta, Rh, or the like is formed on the antiferromagnetic layer 35a with the protective layer 36a provided therebetween at a distance from the inside front portion 35a1 of the antiferromagnetic layer 35a in the track width direction. In addition, the second fixed magnetic material layer 33b, the antiferromagnetic layer 35b, an electrode layer 241b composed of Au, W, Cu, Cr, Ta, Rh, or the like, and the protective layer 36b also form the same structure as described above. As described above, since the electrode layers 241a and 241b are formed apart from the inside front end portions 35a1 and 35b1 of the antiferromagnetic layers 35a and 35b, respectively, a shunt loss of current can be reduced. Protective layers 242a and 242b made of Ta or the like are formed on the respective electrode layers 241a and 241b for covering thereof.

As shown in FIG. 5, in the magnetic sensor 220, an insulating layer 260 made of an insulating material is formed on the second free magnetic material layer 26, and a hard magnetic material layer 261 is further formed above the insulating layer 260 with and an underlying layer 264 made of Cr or the like provided therebetween. The magnetization of the hard magnetic material layer 261 is fixed in the direction opposite to the X direction in the figure.

By magnetostatic coupling generated with the end portion of the soft magnetic material layer 261, the magnetization of which is fixed, through the insulating layer 260, the magnetization of the second free magnetic material layer 26 is aligned in the X direction in the figure. In addition, since the magnetization of the second free magnetic material layer 26 must not be fixed, the thickness thereof is formed larger than that of the soft magnetic material layer 261 so that the magnetization of the second free magnetic material layer 26 is not fixed by the magnetostatic coupling. However, when the thickness of the insulating layer 260 is large, the soft magnetic material layer 261 may have a thickness larger than that of the second free magnetic material layer 26. As a result, the magnetization of the first free magnetic material layer 24 is aligned in the direction opposite to the X direction in the figure by the RKKY interaction generated with the second free magnetic material layer 26.

As described above, by the structure of the magnetic sensor 220, a vertical bias magnetic field can be applied to the free magnetic layer 23, and hence the free magnetic layer 23 can be placed in a single domain state.

The hard magnetic material layer 261 may be formed of a hard magnetic material, such as a CoPt alloy or a CoPtCr alloy. In addition, the protective layer 263 may be formed of Ru, Ta, or the like.

Figure 6:
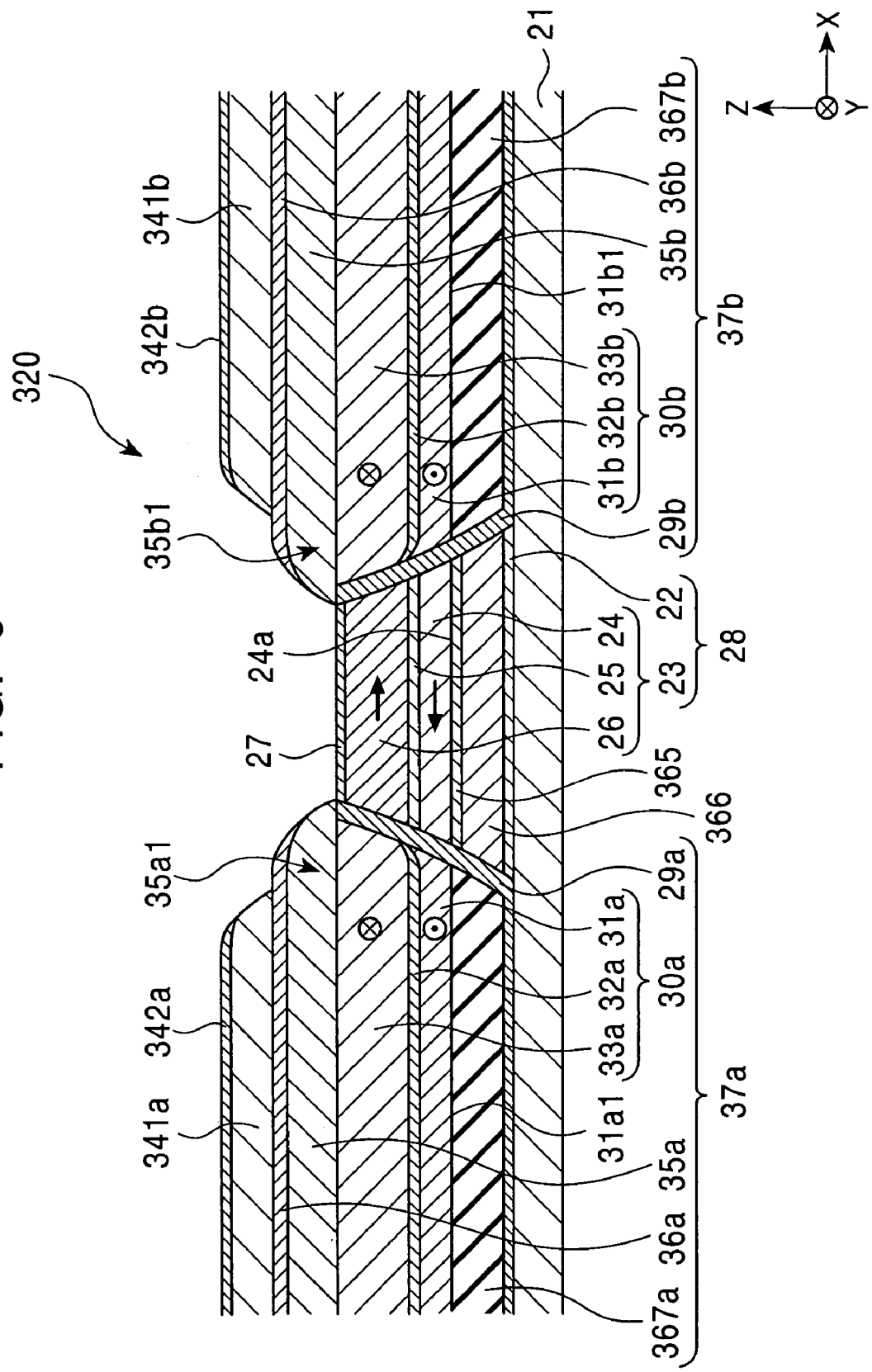
FIG. 6 is a partial cross-sectional view of a magnetic sensor of a fifth embodiment according to the present invention, when it is viewed from a face opposing a recording medium.

FIG. 6 is a partial cross-sectional view of a magnetic sensor of a fifth embodiment according to the present invention, when it is viewed from a face opposing a recording medium.

A magnetic sensor 320 shown in FIG. 6 has the structure equivalent to that of the magnetic sensor 20 shown in FIG. 1. Accordingly, the same reference numerals of the constituent elements of the magnetic sensor 20 shown in FIG. 1 designate the same constituent elements of the magnetic sensor 320, and detailed descriptions thereof will be omitted.

As shown in FIG. 6, in the magnetic sensor 320, as is the magnetic sensor 120 shown in FIG. 4, on the second fixed magnetic material layer 33a, the antiferromagnetic layer 35a is formed, and an electrode layer 341a composed of Au, W, Cu, Cr, Ta, Rh, or the like is formed on the antiferromagnetic layer 35a with the protective layer 36a provided therebetween at a distance from the inside front portion 35a1 of the antiferromagnetic layer 35a in the track width direction. In addition, the second fixed magnetic material layer 33b, the antiferromagnetic layer 35b, an electrode layer 341b composed of Au, W, Cu, Cr, Ta, Rh, or the like, and the protective layer 36b also form the same structure as described above. Protective layers 342a and 342b made of Ta or the like are formed on the respective electrode layers 341a and 341b for covering thereof.

As shown in FIG. 6, in the magnetic sensor 320, under the first free magnetic material layer 24, an antiferromagnetic layer 366 is formed with a non-magnetic conductive layer 365 of Cu or the like provided therebetween.

In addition, on two sides of the non-magnetic conductive layer 365 and the antiferromagnetic layer 366, for example, lifting layers 367a and 367b made of an insulating material are formed with the respective non-magnetic material layers 29a and 29b provided therebetween, and on these lifting layers 367a and 367b, the respective fixed magnetic layers 30a and 30b are formed. Since the fixed magnetic layer 30a is formed on the lifting layer 367a, the lower surface 31a1 of the first fixed magnetic material layer 31a and the lower surface 24a of the first free magnetic material layer 24 are formed at the same height. In addition, since the fixed magnetic layer 30b is formed on the lifting layer 367b, the lower surface 31b1 of the fixed magnetic material layer 31b and the lower surface 24a of the first free magnetic material layer 24 are also formed at the same height. By the formation of the lifting layers 367a and 367b, a shunt loss can be suppressed.

By weak exchange coupling (indirect exchange coupling through the non-magnetic conductive layer 365) with the antiferromagnetic layer 366, the magnetization of the first free magnetic material layer 24 is aligned in the direction opposite to the X direction in the figure. In addition, the magnetization of the second free magnetic material layer 26 is aligned in the X direction in the figure by the RKKY interaction generated with the first free magnetic material layer 24.

As described above, by the structure of the magnetic sensor 320, a vertical bias magnetic field can also be applied to the free magnetic layer 23, and hence the magnetization of the free magnetic layer 23 can be fixed.

The antiferromagnetic layer 366 is formed of a PtMn alloy, an X—Mn alloy (where X is at least one element selected from the group consisting of Pd, Ir, Rh, Ru, Os, Ni, and Fe), or a Pt—Mn—X' alloy (where X' is at least one element selected from the group consisting of Pd, Ir, Rh, Ru, Au, Ag, Os, Cr, Ni, Ar, Ne, Xe, and Kr). In addition, the protective layers 342a and 342b may be formed of Ru, Ta, or the like.

Figure 7:
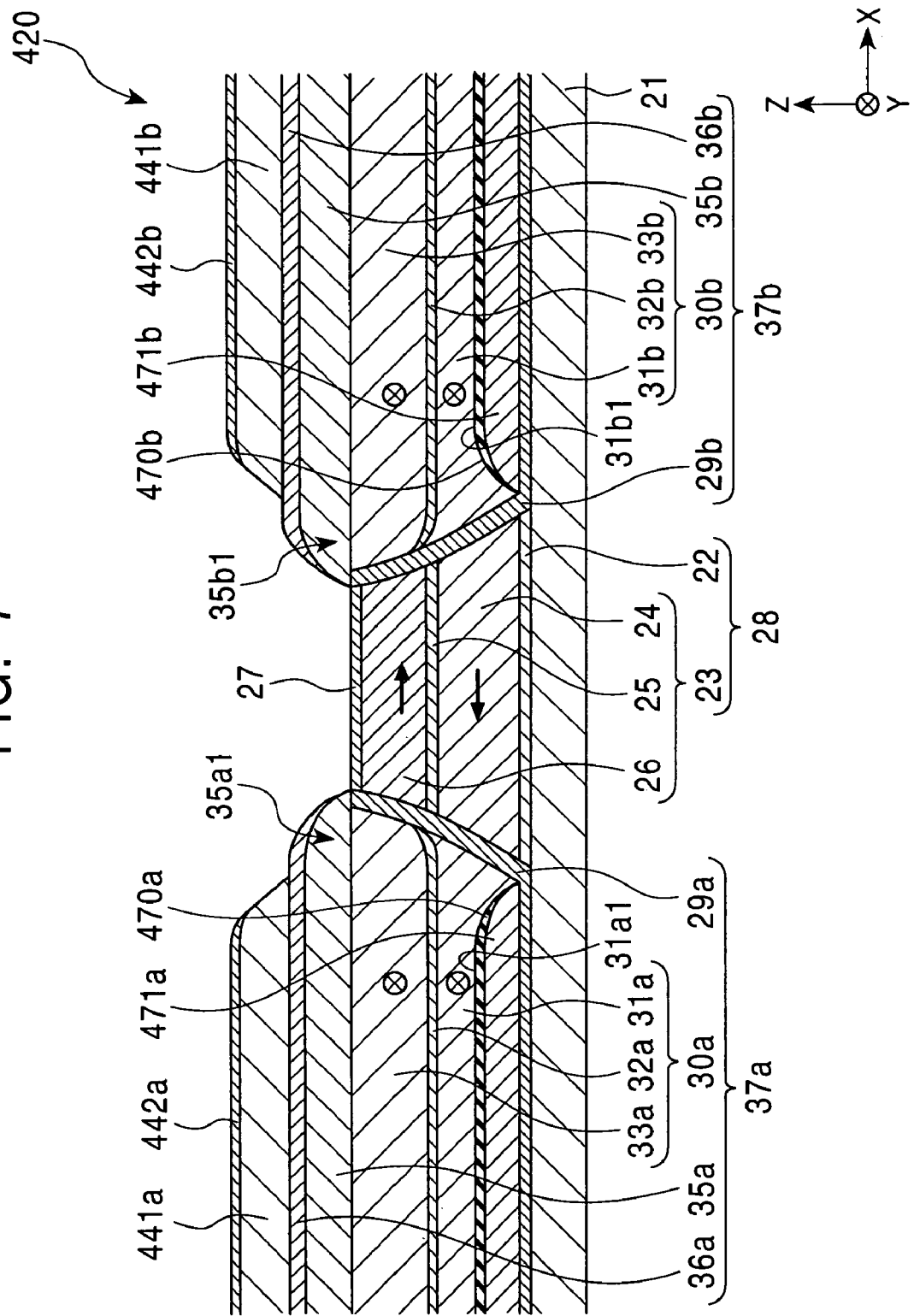
FIG. 7 is a partial cross-sectional view of a magnetic sensor of a sixth embodiment according to the present invention, when it is viewed from a face opposing a recording medium.

FIG. 7 is a partial cross-sectional view of a magnetic sensor of a sixth embodiment according to the present invention, when it is viewed from a face opposing a recording medium.

A magnetic sensor 420 shown in FIG. 7 has the structure equivalent to that of the magnetic sensor 20 shown in FIG. 1. Accordingly, the same reference numerals of the constituent elements of the magnetic sensor 20 shown in FIG. 1 designate the same constituent elements of the magnetic sensor 420, and detailed descriptions thereof will be omitted.

As shown in FIG. 7, in the magnetic sensor 420, as is the magnetic sensor 120 shown in FIG. 4, on the second fixed magnetic material layer 33a, the antiferromagnetic layer 35a is formed, and an electrode layer 441a composed of Au, W, Cu, Cr, Ta, Rh, or the like is formed on the antiferromagnetic layer 35a with the protective layer 36a provided therebetween at a distance from the inside front portion 35a1 of the antiferromagnetic layer 35a in the track width direction. In addition, the second fixed magnetic material layer 33b, the antiferromagnetic layer 35b, an electrode layer 441b composed of Au, W, Cu, Cr, Ta, Rh, or the like, and the protective layer 36b also form the same structure as described above. Protective layers 442a and 442b made of Ta or the like are formed on the respective electrode layers 441a and 441b for covering thereof.

As shown in FIG. 7, in the magnetic sensor 420, under the first fixed magnetic material layers 31a and 31b, hard magnetic material layers (hard bias layers) 471a and 471b are formed, respectively, with respective insulating layers 470a and 470b of an insulating material provided therebetween. The magnetizations of the hard magnetic material layers 471a and 471b are fixed in the direction opposite to the X direction.

As shown in FIG. 7, the magnetization of the first free magnetic material layer 24 is aligned in the direction opposite to the X direction in the figure by vertical bias magnetic fields applied by the hard magnetic material layers 471a and 471b. In addition, the magnetization of the second free magnetic material layer 26 is aligned in the X direction by the RKKY interaction generated with the first free magnetic material layer 24.

As described above, by the structure of the magnetic sensor 420, a vertical bias magnetic field can also be applied to the free magnetic layer 23, and hence the free magnetic layer 23 can be placed in a single domain state.

The hard magnetic material layers 471a and 471b may be formed of a hard magnetic material such as a CoPt alloy or a CoPtCr alloy.

Figure 8:
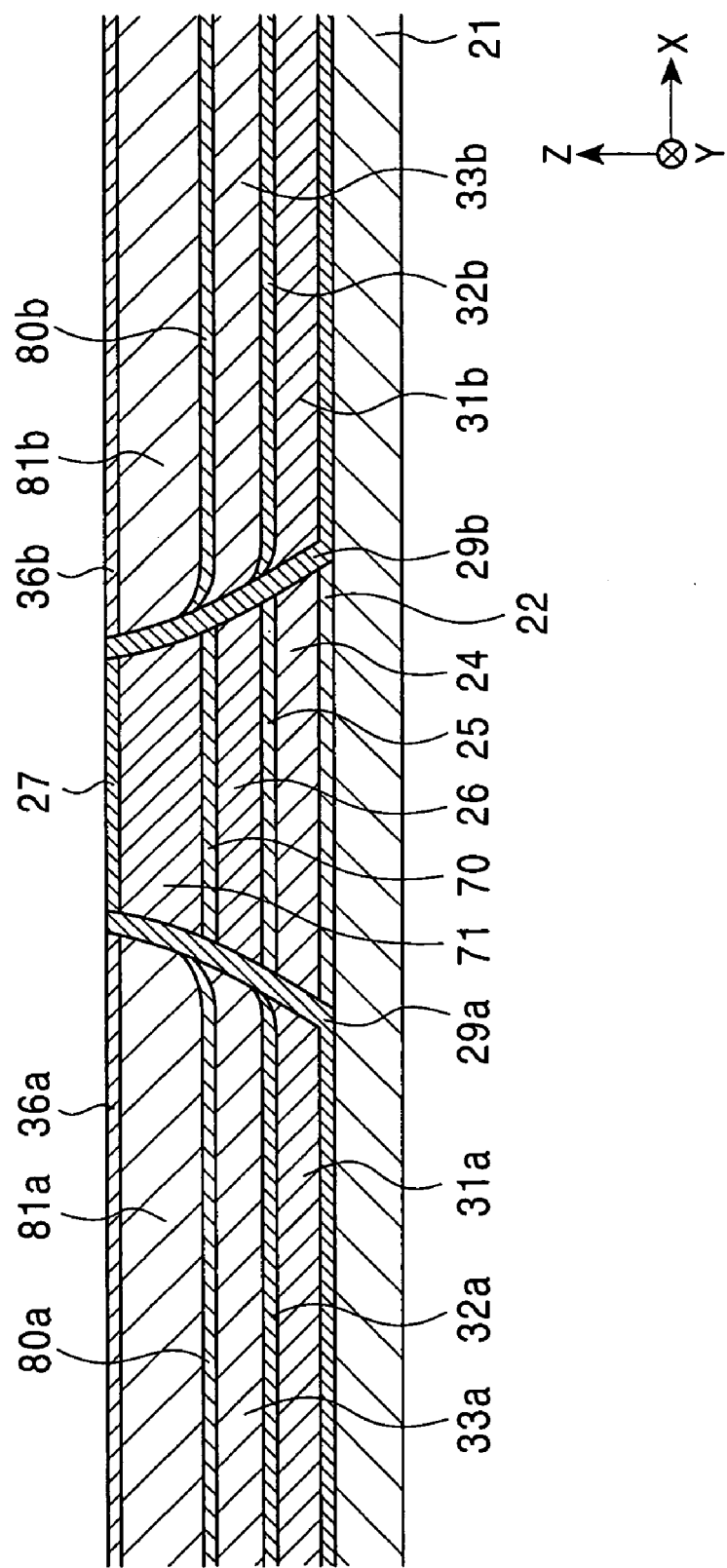
FIG. 8 is a partial cross-sectional view of a magnetic sensor of a seventh embodiment according to the present invention, when it is viewed from a face opposing a recording medium.

In the magnetic sensors 20, 20A, 120, 220, 320, and 420 shown in FIGS. 1, 3, 4, 5, 6, and 7, respectively, the free magnetic layer 23 and the fixed magnetic layers 30a and 30b are each formed of two magnetic material layers; however, each of the free magnetic layer 23 and the fixed magnetic layers 30a and 30b may be formed of at least three magnetic material layers. For example, when the free magnetic layer 23 and the fixed magnetic layers 30a and 30b are each formed of three magnetic material layers, in the free magnetic layer 23, as shown in FIG. 8, the first free magnetic material layer 24 and the second free magnetic material layer 26 are laminated to each other with the non-magnetic intermediate layer 25 provided therebetween, a third free magnetic material layer 71 is formed on the second free magnetic material layer 26 with a non-magnetic magnetic intermediate layer 70 provided therebetween, and the protective layer 27 is provided on the third free magnetic material layer 71.

In addition, in the fixed magnetic layer 30a, the first fixed magnetic material layer 31a and the second fixed magnetic material layer 33a are laminated to each other with the non-magnetic intermediate layer 32a provided therebetween, a third fixed magnetic layer 81a is formed on the second fixed magnetic material layer 33a with a non-magnetic intermediate layer 80a provided therebetween, and the protective layer 36a is formed on the third fixed magnetic material layer 81a. In addition, the first fixed magnetic material layer 31b, the second fixed magnetic material layer 33b, the non-magnetic intermediate layer 32b, a third fixed magnetic layer 81b, a non-magnetic intermediate layer 80b, and the protective layer 36b also form the same structure as described above.

In the case described above, the free magnetic material layer and the fixed magnetic material layer, which are located at the equivalent film positions in the respective laminates, face each other in the track width direction; the free magnetic material layers facing each other in the film thickness direction with the non-magnetic intermediate layer provided therebetween are magnetized antiparallel to each other in the track width direction; the magnetizations of the fixed magnetic material layers facing each other in the film thickness direction with the non-magnetic intermediate layer provided therebetween are fixed antiparallel to each other and orthogonal to the magnetization directions of the free magnetic material layers; and the magnetization of each fixed magnetic material layer of the fixed magnetic layer formed at one side of the free magnetic layer and the magnetization of a corresponding fixed magnetic material layer of the fixed magnetic layer formed at the other side of the free magnetic layer are fixed in the same direction, said each fixed magnetic material layer and said corresponding fixed magnetic material layer being located at equivalent film positions of the respective fixed magnetic layers.

Next, a method for manufacturing the magnetic sensor 20 shown in FIG. 1 will be described.

Figure 9:
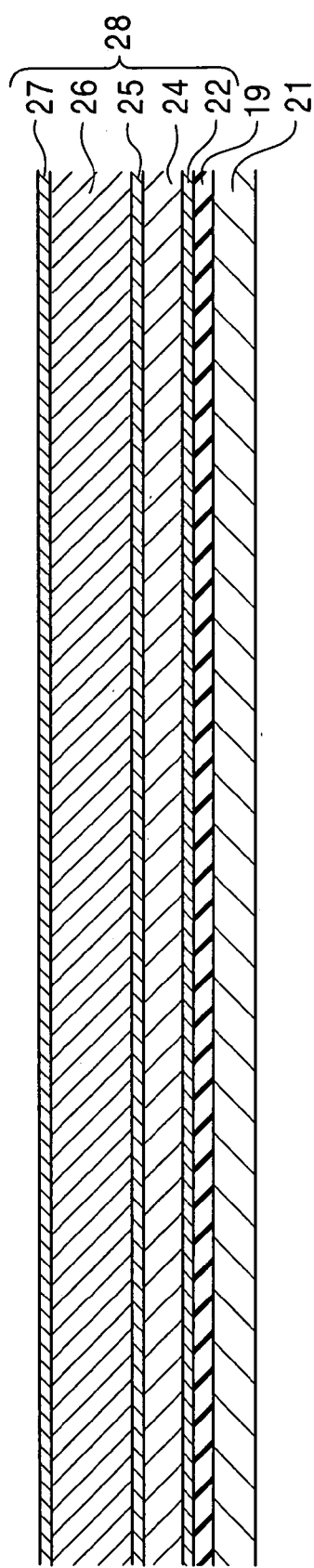
FIG. 9 is a view showing a step for illustrating a manufacturing method of the magnetic sensor shown in FIG. 1.

First, in a step shown in FIG. 9, the lower gap layer 19, the seed layer 22, first free magnetic material layer 24, the non-magnetic intermediate layer 25, the second free magnetic material layer 26, and the protective layer 27 are sequentially formed on the shield layer 21 in that order, thereby forming a multilayer film 28. The formation of the layers is performed by sputtering or deposition.

Figure 10:
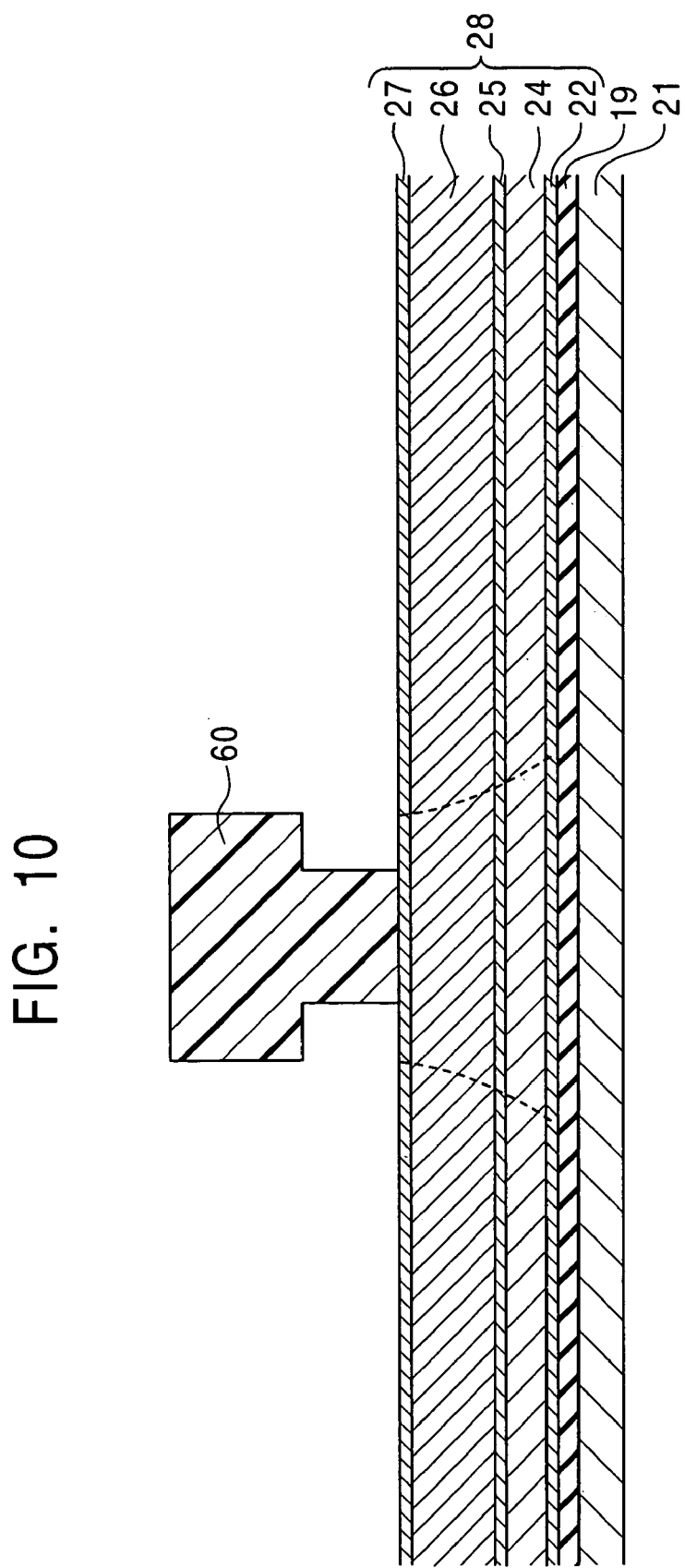
FIG. 10 is a view showing a step of the manufacturing method performed after the step mentioned with reference to FIG. 9.

Next, in a step shown in FIG. 10, a resist layer 60 for lift off is formed on the protective layer 27. This resist layer 60 is used for defining the shape of the multilayer film 28 in the width direction.

After the resist layer 60 is formed on the protective layer 27, the multilayer film 28 which is not covered with the resist layer 60 is removed by ion milling. By this step, the two sides of the multilayer film 28 which are not covered with the resist layer 60 are removed, and the remaining multilayer film 28 has an approximately trapezoidal shape when viewed from a face opposing a recording medium.

Figure 11:
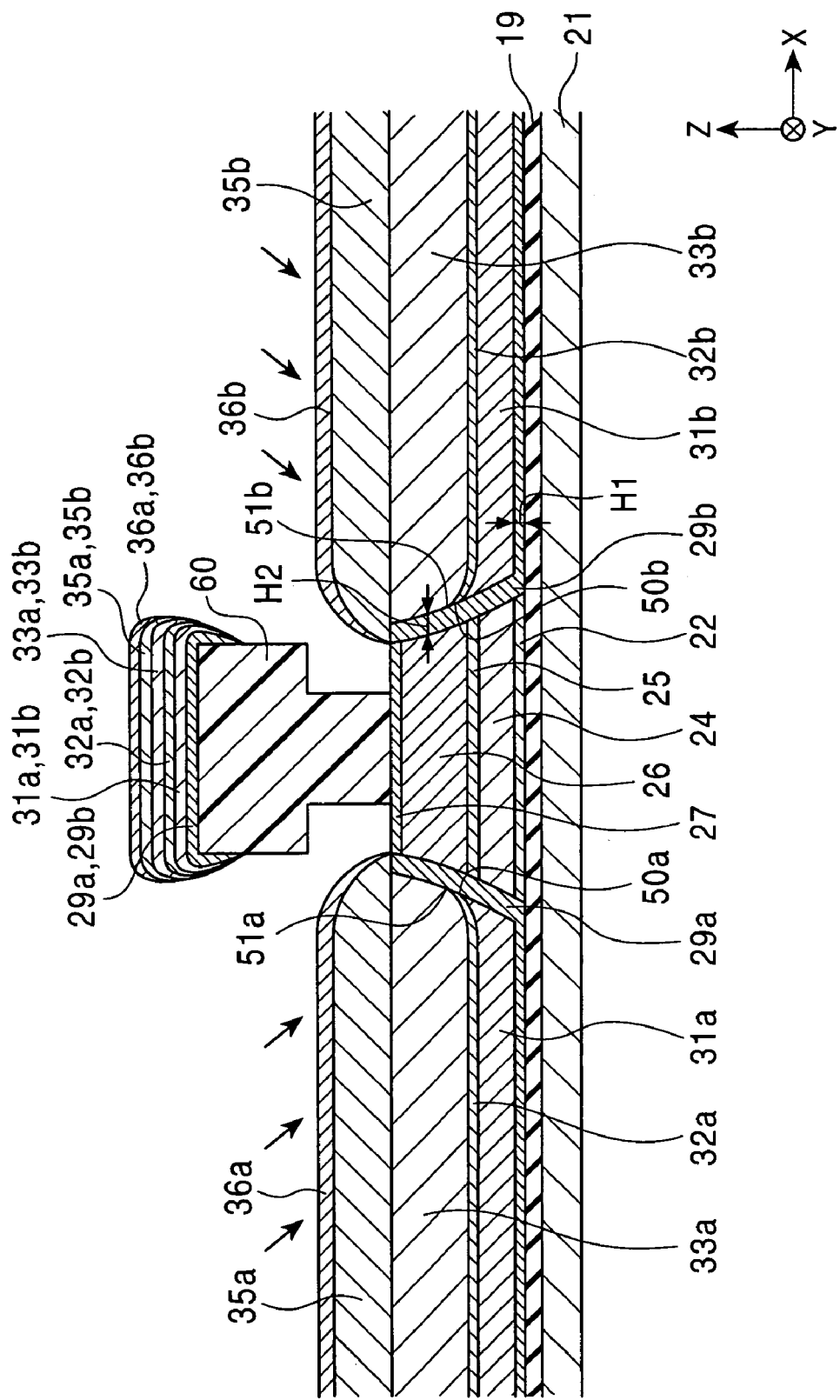
FIG. 11 is a view showing a step of the manufacturing method performed after the step mentioned with reference to FIG. 10.

In a step shown in FIG. 11, while the resist layer 60 remains, the non-magnetic material layers 29a and 29b are formed on the two side surfaces of the multilayer film 28 in the track width direction and on the lower gap layer 19 by sputtering or deposition. In this step, sputtering is preferably performed diagonally from above for forming the non-magnetic material layers 29a and 29b as shown by the arrows in the figure. When sputtering is performed as described above, a film thickness H1 of each of the non-magnetic material layers 29a and 29b at a position in contact with the upper surface of the lower gap layer 19 can be formed smaller than a film thickness H2 of each of the non-magnetic material layers 29a and 29b at a position in contact with the side surface of the multilayer film 28 in the track width direction. By the structure thus formed, a sense current is not allowed to easily flow through the non-magnetic material layers 29a and 29b at positions in contact with the upper surface of the lower gap layer 19. In addition, after being formed by sputtering, the non-magnetic material layers 29a and 29b at positions in contact with the upper surface of the lower gap layer 19 may be completely removed by a milling step. In this case, a shunt of a sense current can be further suppressed.

Next, the first fixed magnetic material layer 31a, the non-magnetic intermediate layer 32a, the second fixed magnetic material layer 33a, the antiferromagnetic layer 35a, and the protective layer 36a are sequentially formed on the non-magnetic material layer 29a by sputtering or deposition. At the same time, the first fixed magnetic material layer 31b, the non-magnetic intermediate layer 32b, the second fixed magnetic material layer 33b, the antiferromagnetic layer 35b, and the protective layer 36b are also sequentially formed on the non-magnetic material layer 29b by sputtering or deposition. In addition, on the resist layer 60, the same material layers are formed as the non-magnetic material layer 29a (29b), the first fixed magnetic material layer 31a (31b), the non-magnetic intermediate layer 32a (32b), the second fixed magnetic material layer 33a (33b), the antiferromagnetic layer 35a (35b), and the protective layer 36a (36b).

Figure 12:
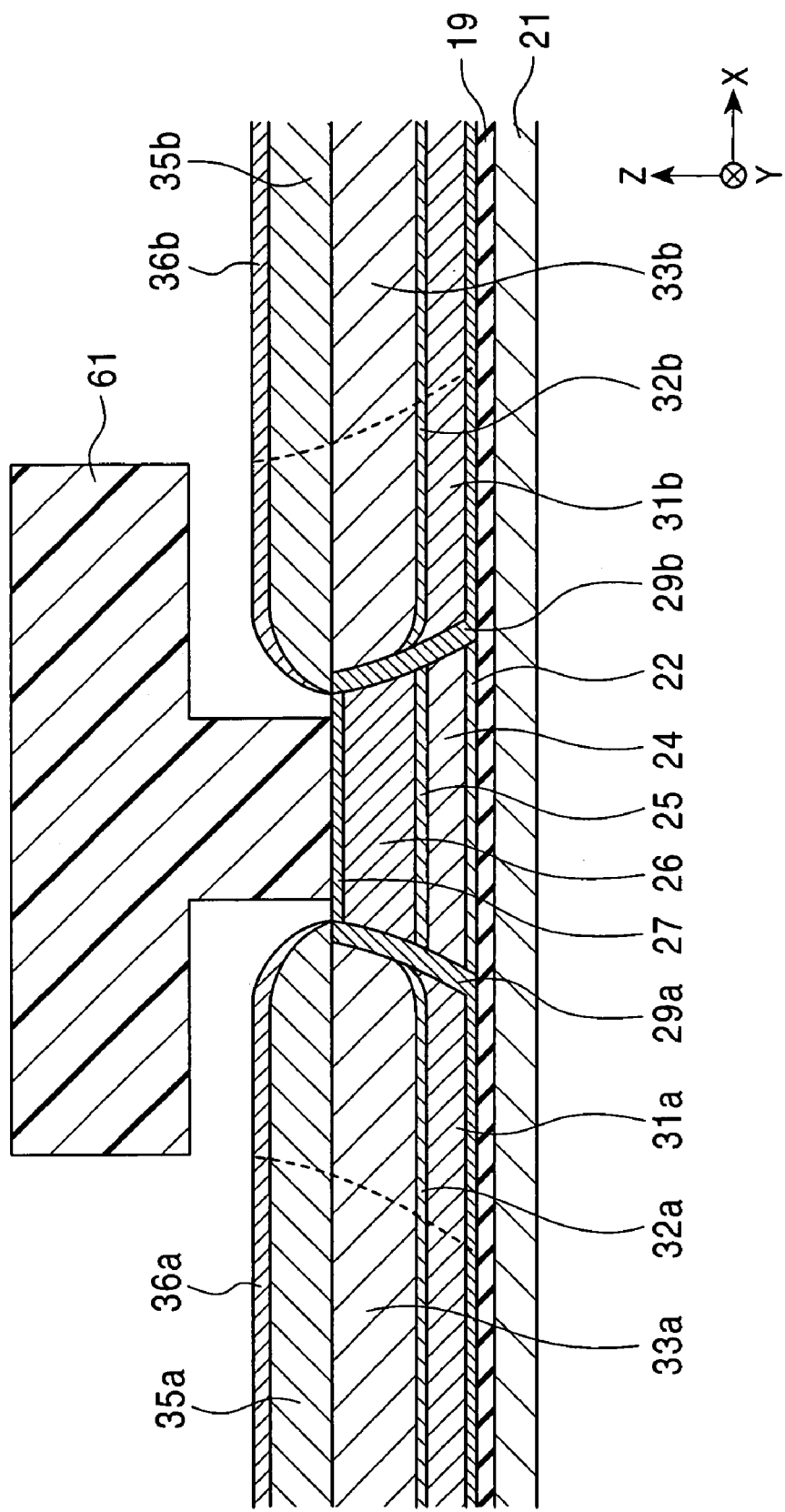
FIG. 12 is a view showing a step of the manufacturing method performed after the step mentioned with reference to FIG. 11.

After the resist layer 60 is removed in a step shown in FIG. 12, a resist layer 61 for lift off is formed on the protective layer 27. After the resist layer 61 is formed on the protective layer 27, parts of the non-magnetic material layers 29a and 29b, the first fixed magnetic material layers 31a and 31b, the non-magnetic intermediate layers 32a and 32b, the second fixed magnetic material layers 33a and 33b, the antiferromagnetic layers 35a and 35b, and the protective layers 36a and 36b, which are not covered with the resist layer 61, are removed by ion milling. By this step, two sides of from the non-magnetic material layer 29a to the protective layer 36a and of from the non-magnetic material layer 29b to the protective layer 36b, which are not covered with the resist layer 61, are removed, and as a result, the two sides each have an inclined surface or a curved surface.

Figure 13:
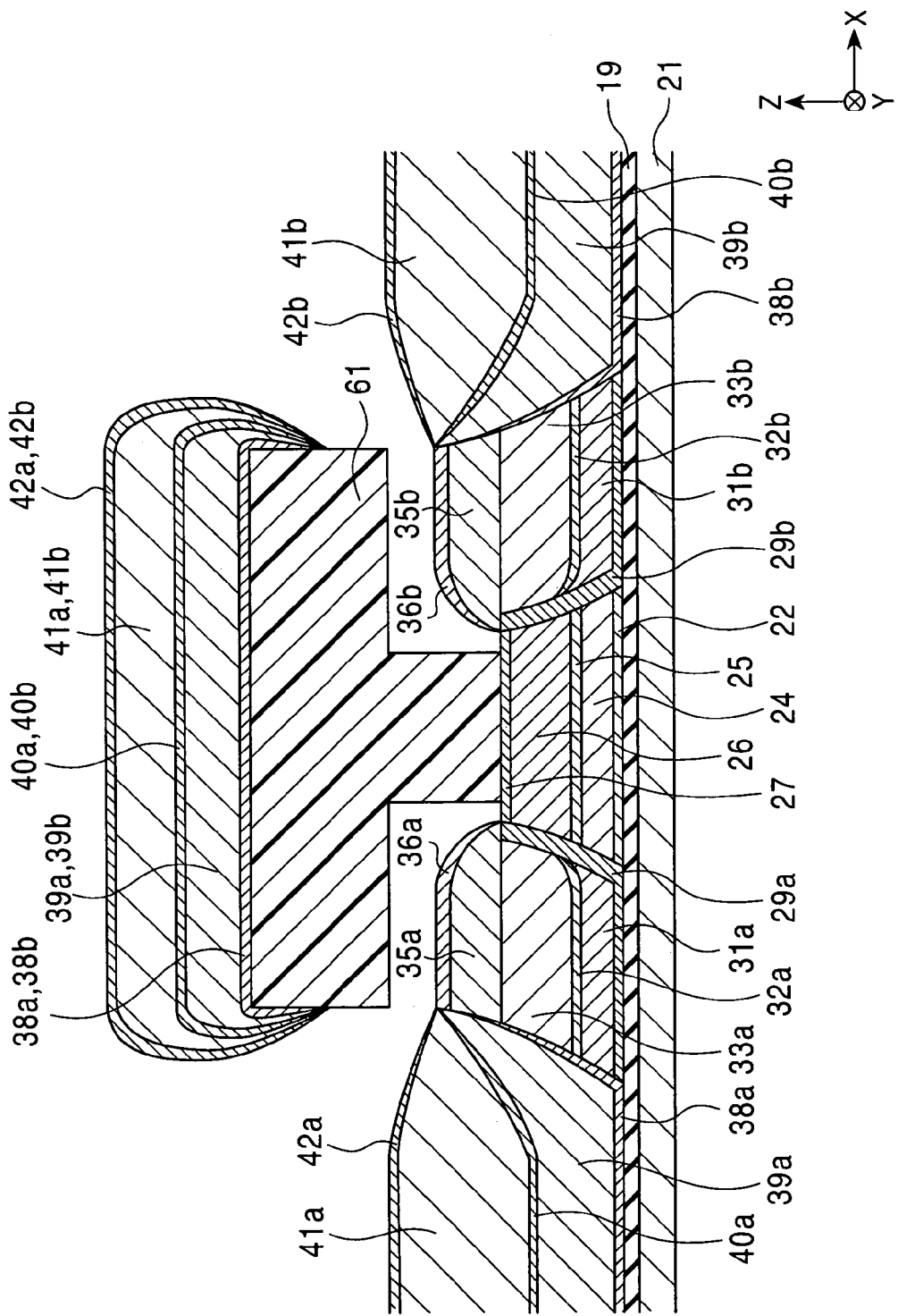
FIG. 13 is a view showing a step of the manufacturing method performed after the step mentioned with reference to FIG. 12.
Figure 14:
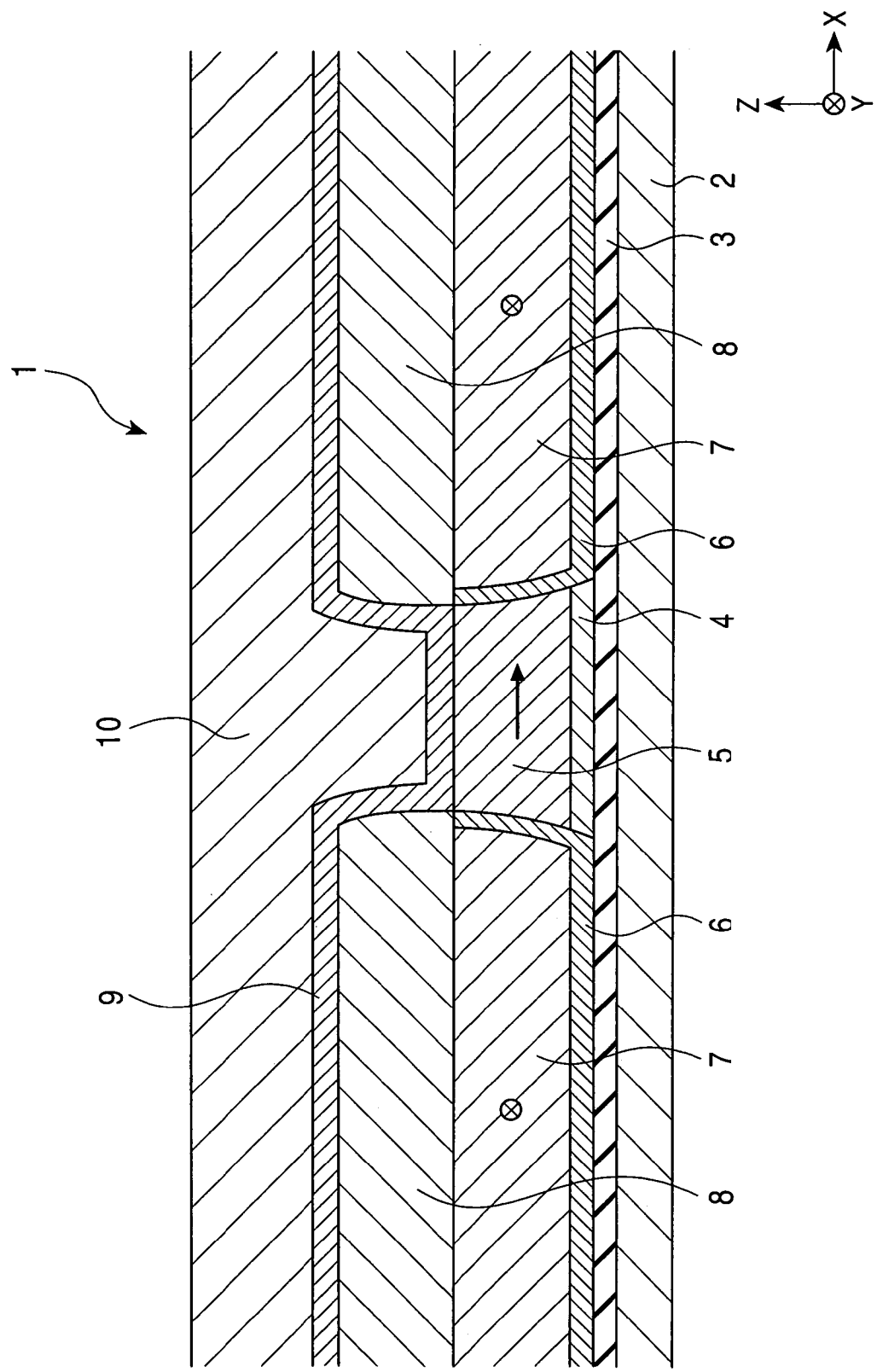
FIG. 14 is a partial cross-sectional view showing a related magnetic sensor when it is viewed from a face opposing a recording medium.
Figure 15:
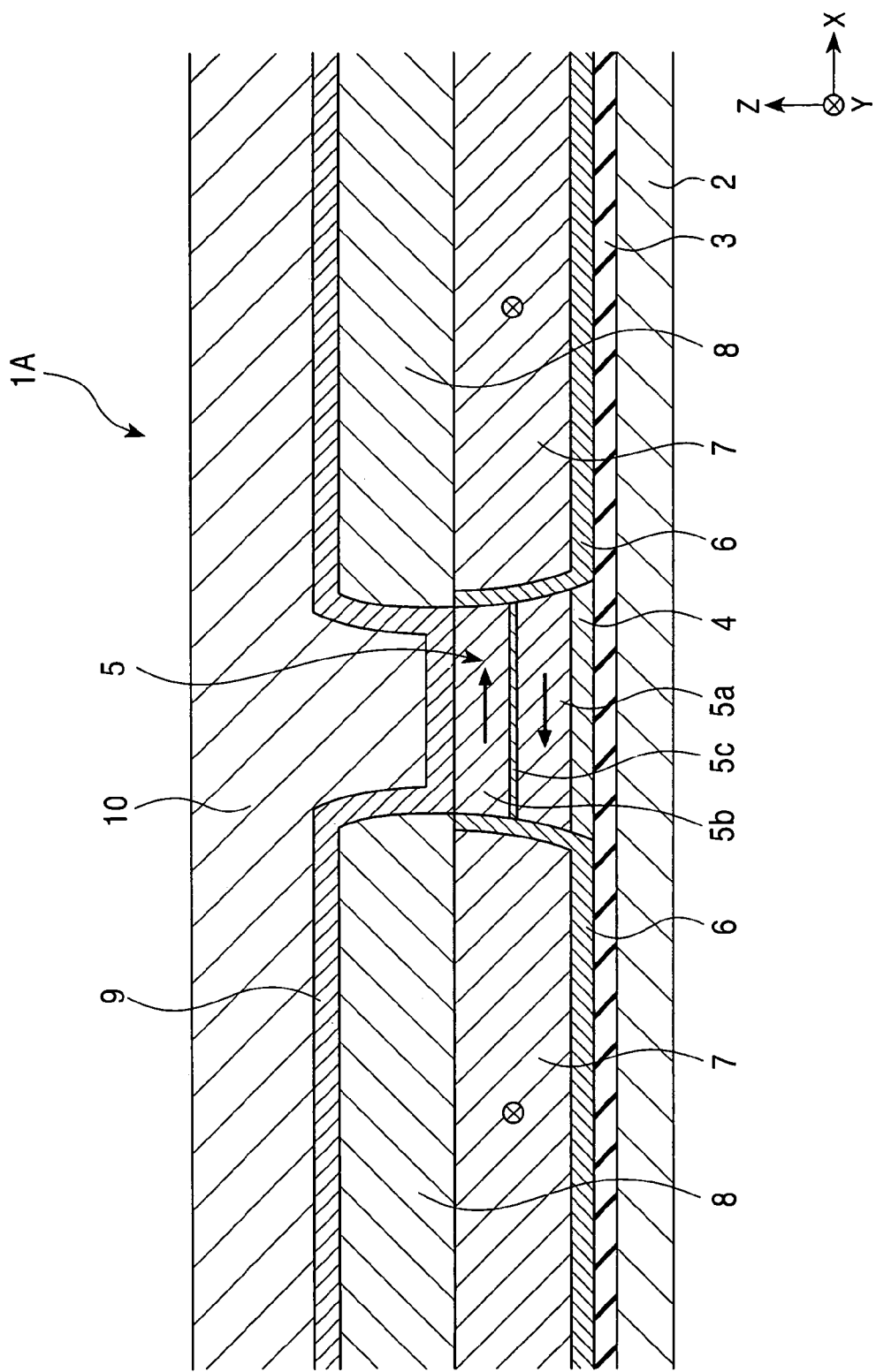
FIG. 15 is a partial cross-sectional view showing another related magnetic sensor when it is viewed from a face opposing a recording medium.

In a step shown in FIG. 13, while the resist layer 61 remains, on the side surfaces in the track width direction of laminates formed of the respective non-magnetic material layers 29a and 29b, the protective layer 36a and 36b, and the like in the track width direction, and on exposed parts of the lower gap layer 19, the bias underlayers 38a and 38b are formed by sputtering or deposition, and on the bias underlayers 38a and 39b, the hard magnetic layers (hard bias layer) 39a and 39b, the spacer layers 40a and 40b, the electrode layers 41a and 41b, and the protective layers 42a and 42b are sequentially formed, respectively, by sputtering or deposition. In addition, on the resist layer 61, the bias underlayer 38a (38b), the hard magnetic layer 39a (39b), the spacer layer 40a (40b), the electrode layer 41a (41b), and the protective layer 42a (42b) are also formed.

Next, when the resist layer 61 is removed, the magnetic sensor 20 shown in FIG. 1 is obtained.

When the magnetic sensor 20A shown in FIG. 3 is manufactured, in the step shown in FIG. 9, after the non-magnetic intermediate layer 25 composing the free magnetic layer 23 is formed, the specular layer 55 may be formed on the non-magnetic intermediate layer 25, followed by forming the second free magnetic material layer 26 and the protective layer 27 on the specular layer 55 in that order. In addition, when the structure is formed in which the specular layers 56a and 56b are formed on the non-magnetic intermediate layers 32a and 32b, respectively, which form the respective fixed magnetic layers 30a and 30b, in the step shown in FIG. 11, after the non-magnetic intermediate layer 32a is formed, the specular layer 56a is formed thereon, and on the specular layer 56a, the second fixed magnetic material layer 33a, the antiferromagnetic layer 35a, and the protective layer 36a may be formed in that order. In the same manner as described above, the non-magnetic intermediate layer 32b, the specular layer 56b, the second fixed magnetic material layer 33b, the antiferromagnetic layer 35b, and the protective layer 36b are obviously formed at the same time.

When the magnetic sensor 120 shown in FIG. 4 is manufactured, in the step shown in FIG. 9, after the second free magnetic material layer 26 is formed, the insulating layer 160, the soft magnetic material layer 161, the antiferromagnetic layer 162, and the protective layer 163 are sequentially formed. Next, on the protective layer 163, a resist layer for lift off is formed, and parts of the structure from the seed layer 22 to the protective layer 163, which are not covered with the resist layer, are removed by ion milling. Next, in the step shown in FIG. 11, after the first fixed magnetic material layer 31a, the non-magnetic intermediate layer 32a, the second fixed magnetic material layer 33a, the antiferromagnetic layer 35a, and the protection layer 36a are formed on the non-magnetic material layer 29a by sputtering or deposition, the electrode layer 141a and the protective layer 142a are formed on the protective layer 36a. In the same manner as described above, the first fixed magnetic material layer 31b, the non-magnetic intermediate layer 32b, the second fixed magnetic material layer 33b, the antiferromagnetic layer 35b, the protection layer 36b, the electrode layer 141b, and the protective layer 142b are obviously formed at the same time.

When the magnetic sensor 220 shown in FIG. 5 is manufactured, in the step shown in FIG. 9, after the second free magnetic material layer 26 is formed, the insulating layer 260, the underlying layer 264, the hard magnetic material layer 261, and the protective layer 263 are sequentially formed. Next, on the protective layer 263, a resist layer for lift off is formed, and parts of the structure from the seed layer 22 to the protective layer 263, which are not covered with the resist layer, are removed by ion milling. Next, in the step shown in FIG. 11, after the first fixed magnetic material layer 31a, the non-magnetic intermediate layer 32a, the second fixed magnetic material layer 33a, the antiferromagnetic layer 35a, and the protective layer 36a are formed on the non-magnetic material layer 29a by sputtering or deposition, the electrode layer 241a and the protective layer 242a are formed on the protective layer 36a. In the same manner as described above, the first fixed magnetic material layer 31b, the non-magnetic intermediate layer 32b, the second fixed magnetic material layer 33b, the antiferromagnetic layer 35b, the protection layer 36b, the electrode layer 241b, and the protective layer 242b are obviously formed at the same time.

When the magnetic sensor 320 shown in FIG. 6 is manufactured, in the step shown in FIG. 9, after the seed layer 22 is formed, the antiferromagnetic layer 366 and the non-magnetic conductive layer 365 are formed, and on the surface thereof, the first free magnetic material layer 24, the non-magnetic intermediate layer 25, the second free magnetic material layer 26, and the protective layer 27 are formed. Next, on the protective layer 27, a resist layer for lift off is formed, and parts of the structure from the seed layer 22 to the protective layer 27, which are not covered with the resist layer, are removed by ion milling. Next, in the step shown in FIG. 11, after the lifting layer 367a, the first fixed magnetic material layer 31a, the non-magnetic intermediate layer 32a, the second fixed magnetic material layer 33a, the antiferromagnetic layer 35a, and the protective layer 36a are formed on the non-magnetic material layer 29a by sputtering or deposition, the electrode layer 341a and the protective layer 342a are formed on the protective layer 36a. In the same manner as described above, the lifting layer 367b, the first fixed magnetic material layer 31b, the non-magnetic intermediate layer 32b, the second fixed magnetic material layer 33b, the antiferromagnetic layer 35b, the protection layer 36b, the electrode layer 341b, and the protective layer 342b are obviously formed at the same time.

When the magnetic sensor 420 shown in FIG. 7 is manufactured, in the step shown in FIG. 11, after the hard magnetic material layer 471a is formed on the non-magnetic material layer 29a by a lift-off method, the first fixed magnetic material layer 31a, the non-magnetic intermediate layer 32a, the second fixed magnetic material layer 33a, the antiferromagnetic layer 35a, and the protective layer 36a are formed by sputtering or deposition, and the electrode layer 441a and the protective layer 442a are formed on the protective layer 36a. In the same manner as described above, the hard magnetic material layer 471b, the first fixed magnetic material layer 31b, the non-magnetic intermediate layer 32b, the second fixed magnetic material layer 33b, the antiferromagnetic layer 35b, the protection layer 36b, the electrode layer 441b, and the protective layer 442b are obviously formed at the same time.

The magnetic sensor of the present invention is not only applied to a thin-film magnetic head mounted on a hard disc device but is also applied to a magnetic head used together with tapes, a magnetic sensing device, and the like.

Although the preferred embodiments of the present invention are described above, the present invention is not limited thereto and may be changed or modified without departing from the spirit and the scope of the present invention.

In addition, it is to be understood that the above embodiments are described by way of example, and that the present invention are not limited thereto.

For example, the structure may be formed in which a non-magnetic material layer and a fixed magnetic layer are only formed at one side of the free magnetic layer and in which a non-magnetic material layer is formed on the other side of the free magnetic layer.

In the magnetic sensor of the present invention, even though the fixed magnetic layer and the free magnetic layer each have a synthetic ferrimagnetic structure, since the fixed magnetic material layers and the respective free magnetic material layer are on the equivalent film positions in the respective laminates, when conduction electrons e⁻ are transferred from the fixed magnetic layer to the corresponding free magnetic material layer, an area in which the resistance is increased is small, and hence the resistance of each free magnetic material layer can be decreased. Accordingly, the change in resistance is not decreased, and hence decrease in sensitivity can be prevented.

What is claimed is:

1. A magnetic sensor comprising:
    a shield layer;
    a gap layer provided on the shield layer;
    a free magnetic layer provided on the gap layer;
    at least one non-magnetic material layer provided on one side surface of the free magnetic layer; and
    at least one fixed magnetic layer facing the free magnetic layer through the non-magnetic material layer, in which current flows in a direction intersecting an interface between the free magnetic layer and the non-magnetic material layer and an interface between the fixed magnetic layer and the non-magnetic material layer,
    wherein the free magnetic layer comprising an upper tree magnetic material layer and a lower free magnetic material layer, wherein the upper and lower free magnetic material layers are separated by a first non-magnetic intermediate layer, and are magnetized anti-parallel to each other in a track width direction,
    wherein the fixed magnetic layer comprising an upper fixed magnetic material layer and a lower fixed magnetic material layer, wherein the upper and lower fixed magnetic material layers separated by a second non-magnetic intermediate layer, and are magnetized anti-parallel to each other and orthogonal to the magnetization of the tree magnetic material layers, and
    wherein a side end surface of the upper free magnetic material layer faces the upper fixed magnetic material layer through the non-magnetic material layer, and a side end surface of the lower free magnetic material layer faces the lower fixed magnetic material layer through the non-magnetic material layer;
    wherein the top surface of the lower fixed magnetic material layer is lower than the bottom surface of the upper free magnetic material layer, and the position of the bottom surface of the upper fixed magnetic material layer is higher than the position of the top surface of the lower free magnetic material layer.

2. The magnetic sensor according to claim 1, further comprising:
    an antiferromagnetic layer provided on the fixed magnetic layer.

3. The magnetic sensor according to claim 1,
    wherein the non-magnetic material layers and the fixed magnetic layers are provided on two side surfaces of the free magnetic layer, and
    the upper fixed magnetic material layers of the fixed magnetic layers provided on the two side of the free magnetic layer are magnetized in the same direction, the lower fixed magnetic material layers of the fixed magnetic layers provided on the two side of the free magnetic layer are magnetized in the same direction.

4. The magnetic sensor according to claim 1,
    wherein the upper fixed magnetic material layers of the fixed magnetic layers provided on the two side of the free magnetic layer have $\beta$ of the same positive or the same negative sign, the lower fixed magnetic layers of the fixed magnetic layers provided on the two side of the free magnetic layer have $\beta$ of the same positive or the same negative sign, and
    the following equation is satisfied:
    $\rho\uparrow/\rho\downarrow = (1-\beta)/(1-\beta)$, where $-1 \leq \beta \leq 1$, $\rho\downarrow$ represents a resistivity to minority conduction electrons of the whole conduction electrons, and $\rho\uparrow$ represents a resistivity to majority conduction electrons.

5. The magnetic sensor according to claim 1, further comprising a specular layer,
    wherein the specular layer is provided at at least one of interfaces between the second non-magnetic intermediate layer and the upper or lower fixed magnetic material layers, which form the fixed magnetic layer, and interfaces between the first non-magnetic intermediate layer and the free magnetic material layers, which form the free magnetic layer, or is provided in one of the upper and lower fixed magnetic material layers and the upper and lower free magnetic material layers.

6. The magnetic sensor according to claim 1, wherein the non-magnetic material layer has a smaller thickness at a position in contact with an upper surface of the gap layer than that at a position in contact with a side surface of the free magnetic layer in the track width direction.

7. The magnetic sensor according to claim 1, wherein the non-magnetic material layer is provided on the one side surface of the free magnetic layer and is not provided on the gap layer.

* * * * *

UNITED STATES PATENT AND TRADEMARK OFFICE
CERTIFICATE OF CORRECTION

PATENT NO. : 7,218,485 B2
APPLICATION NO. : 10/755641
DATED : May 15, 2007
INVENTOR(S) : Naoya Hasegawa et al.

It is certified that error appears in the above-identified patent and that said Letters Patent is hereby corrected as shown below:

In the Claims

In column 24, claim 1, line 5, after "comprising an upper" replace "tree" with --free--.

In column 24, claim 1, line 17, before "magnetic material layers," replace "tree" with --free--.

In column 24, claim 4, line 53, before "where" replace "$\rho\uparrow/\rho\downarrow=(1=\beta)/(1-\beta),$" with --$\rho\downarrow/\rho\uparrow=(1+\beta)/(1-\beta),$--.

Signed and Sealed this

Second Day of November, 2010

David J. Kappos
*Director of the United States Patent and Trademark Office*